(12) United States Patent
Yang et al.

(10) Patent No.: US 10,175,808 B2
(45) Date of Patent: Jan. 8, 2019

(54) IN-CELL TOUCH SCREEN PANEL, DRIVING METHOD THEREOF, AND DISPLAY DEVICE

(71) Applicants: Boe Technology Group Co., Ltd., Beijing (CN); Beijing Boe Optoelectronics Technology Co., Ltd., Beijing (CN)

(72) Inventors: Shengji Yang, Beijing (CN); Xue Dong, Beijing (CN); Hailin Xue, Beijing (CN); Haisheng Wang, Beijing (CN); Xiaochuan Chen, Beijing (CN); Hongjuan Liu, Beijing (CN); Tuo Sun, Beijing (CN); Lifei Ma, Beijing (CN); Wen Sun, Beijing (CN); Rui Xu, Beijing (CN); Lei Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/038,193

(22) PCT Filed: Oct. 20, 2015

(86) PCT No.: PCT/CN2015/092298
§ 371 (c)(1),
(2) Date: May 20, 2016

(87) PCT Pub. No.: WO2016/206251
PCT Pub. Date: Dec. 29, 2016

(65) Prior Publication Data
US 2017/0177139 A1  Jun. 22, 2017

(30) Foreign Application Priority Data

Jun. 23, 2015  (CN) .......................... 2015 1 0349957

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ...................................................... G06F 3/041
See application file for complete search history.

(56) References Cited

U.S. PATENT DOCUMENTS

2011/0074757 A1   3/2011  Chung et al.
2011/0109568 A1*  5/2011  Wu ....................... G06F 3/0412
                                                          345/173
(Continued)

FOREIGN PATENT DOCUMENTS

CN    1361510      7/2002
CN    101894856    11/2010
(Continued)

OTHER PUBLICATIONS

International Search Report and Written Opinion from PCT/CN2015/0092298 dated Mar. 21, 2016.
(Continued)

*Primary Examiner* — Alexander Eisen
*Assistant Examiner* — Cory A Almeida
(74) *Attorney, Agent, or Firm* — Calfee, Halter & Griswold LLP

(57) ABSTRACT

An in-cell touch screen panel, a driving method thereof and a display device. A plurality of sub-pixels are grouped into sub-pixel groups, each of which includes at least two sub-pixels, and cathode layers of different sub-pixel groups are independent of one another. The cathode layers are reused as
(Continued)

self-capacitance electrodes, and a driving chip determines a touch position by detecting a change in capacitance of the cathode layer, thereby achieving touch control functionality. The driving chip outputs, in a fourth phase, signals to respective cathode layers and signal terminals of each sub-pixel circuit, each of the signals is a superposition of the signal output in a third phase with a touch scanning signal.

18 Claims, 15 Drawing Sheets

(51) Int. Cl.
*G09G 3/3258* (2016.01)
*G09G 3/3291* (2016.01)
*H01L 27/32* (2006.01)
*G09G 3/3233* (2016.01)

(52) U.S. Cl.
CPC ......... *G09G 3/3233* (2013.01); *G09G 3/3258* (2013.01); *G09G 3/3291* (2013.01); *H01L 27/323* (2013.01); *H01L 27/3255* (2013.01); *G09G 2300/0426* (2013.01); *G09G 2300/0814* (2013.01); *G09G 2300/0819* (2013.01); *G09G 2300/0842* (2013.01); *G09G 2310/0251* (2013.01); *G09G 2310/08* (2013.01); *G09G 2320/0646* (2013.01)

(56) References Cited

U.S. PATENT DOCUMENTS

| | | |
|---|---|---|
| 2014/0225838 A1 | 8/2014 | Gupta et al. |
| 2015/0221255 A1 | 8/2015 | Qing et al. |

FOREIGN PATENT DOCUMENTS

| | | |
|---|---|---|
| CN | 103208255 | 7/2013 |
| CN | 103208255 A | 7/2013 |
| CN | 103456267 | 12/2013 |
| CN | 104681179 | 9/2015 |
| CN | 104898887 | 9/2015 |
| CN | 104898888 | 9/2015 |
| CN | 1048988887 | 9/2015 |

OTHER PUBLICATIONS

First Office Action for Chinese Patent Application No. 201510349957.1 dated May 15, 2017.

* cited by examiner

In a first phase, the driving chip outputs a reset control signal to the reset control signal terminal, a light-emitting control signal to the light-emitting control signal terminal, a first reference signal to the first reference signal terminal, a second reference signal to the second reference signal terminal, and a third reference signal to the cathode layer of the organic light-emitting device through a corresponding wire, such that the light-emitting control module supplies the signal of the first reference signal terminal to the second node, the reset control module causes the first node to be in conduction with the second node, and the voltage stabilizing module begins to charge — S101

In a second phase, the driving chip outputs a write control signal to the write control signal terminal, a data signal to the data signal terminal, the first reference signal to the first reference signal terminal, the second reference signal to the second reference signal terminal, and the third reference signal to the cathode layer of the organic light-emitting device in the sub-pixels through the corresponding wire, such that the write compensating module supplies the signal of the data signal terminal and a preset threshold voltage to the first node, and the voltage stabilizing module begins to discharge, wherein the preset threshold voltage has a difference from a threshold voltage of the driving control module in a preset range — S102

In a third phase, the driving chip outputs a light-emitting control signal to the light-emitting control signal terminal, the first reference signal to the first reference signal terminal, the second reference signal to the second reference signal terminal, and the third reference signal to the cathode layer of the organic light-emitting device in the sub-pixels through the corresponding wire, such that the first node is in a floating state, the voltage stabilizing module maintains a voltage difference thereacross at a fixed value, and the driving control module, under joint control of the voltage stabilizing module and the light-emitting control module, drives the organic light-emitting device to emit light — S103

In a fourth phase, the driving chip outputs to the signal terminals of the sub-pixel circuit and to the cathode layer of each sub-pixel group a superposition of respective signals output to the signal terminals and the cathode layer in the third phase with a same touch scanning signal such that the modules of the sub-pixel circuit operate in the same state as in the third phase, and the driving chip determines a touch position by detecting a change in capacitance of the cathode layer via the corresponding wire — S104

Fig. 10

IN-CELL TOUCH SCREEN PANEL, DRIVING METHOD THEREOF, AND DISPLAY DEVICE

CROSS-REFERENCE TO THE RELATED APPLICATIONS

The present application is the U.S. national phase entry of PCT/CN2015/092298, with an international filing date of Oct. 20, 2015, which claims the benefit of Chinese Patent Application No. 201510349957.1, filed on Jun. 23, 2015, the entire disclosures of which are incorporated herein by reference.

TECHNICAL FIELD

The present disclosure relates to the field of touch display technologies, and particularly to an in-cell touch screen panel, a driving method thereof, and a display device.

BACKGROUND

With swift development of the display technologies, touch screen panels have been applied extensively. At present, touch screen panels may be classified in terms of their composition and structure into add-on touch panels, on-cell touch panels and in-cell touch panels. For the add-on touch panel, a touch screen panel and a display screen are produced separately, and then fitted together to form a display screen which has a touch function. The add-on touch panel has drawbacks such as a higher manufacturing cost, a lower light transmissivity and a thicker module. With touch electrodes of a touch screen panel being embedded in a display screen, the in-cell touch panel appeals to panel manufactures since it may have a thinner thickness of the module as a whole, and substantially reduced manufacturing cost.

Currently, in-cell touch screen panels are mainly used in liquid crystal display screens. As well known, the organic light-emitting diode (OLED) display screen is among intensively investigated fields of state-of-the-art flat panel displays. As compared with the liquid crystal display screen, the OLED display screen has advantages such as low energy consumption, low product cost, self-light emission, a wide view angle, and quick responsiveness. Presently, the OLED display screens have begun to replace conventional LCD display screens in the display applications such as mobile phones, PDAs and digital cameras. Hence, it is a technical problem that needs an urgent solution for a person having ordinary skill in the art to provide an OLED display screen-based in-cell touch screen panel.

SUMMARY

In view of the above, embodiments of the present disclosure provide an in-cell touch screen panel, a driving method thereof, and a display device, which are used to implement an organic light-emitting display screen-based in-cell touch screen panel.

According to a first aspect of the present disclosure, an in-cell touch screen panel is provided which comprises an array substrate, a plurality of sub-pixels located on the array substrate, each of the plurality of sub-pixels comprising an organic light-emitting device and a sub-pixel circuit electrically connected with the organic light-emitting device, the organic light-emitting device comprising an anode layer, a light-emitting layer and a cathode layer that are located on the array substrate in turn, and a driving chip. The plurality of sub-pixels are grouped into sub-pixel groups, each of which comprises at least two sub-pixels. The cathode layers of different sub-pixel groups are independent of one another. The driving chip outputs signals to signal terminals of each sub-pixel circuit and to the cathode layer of each sub-pixel group. Each of the signals output in a touch scanning phase is a superposition of the signal output in a preceding phase with a touch scanning signal such that each sub-pixel circuit operates in the touch scanning phase in the same state as in the preceding phase.

In some embodiments, the sub-pixel circuit comprises a write compensating module, a voltage stabilizing module, a reset control module, a light-emitting control module, a driving control module, a data signal terminal, a write control signal terminal, a reset control signal terminal, a light-emitting control signal terminal, a first reference signal terminal and a second reference signal terminal. An input terminal of the write compensating module is connected with the data signal terminal, a control terminal thereof is connected with the write control signal terminal, and an output terminal thereof is connected with a first node which is a connection point of the write compensating module and the reset control module. An input terminal of the light-emitting control module is connected with the first reference signal terminal, a control terminal thereof is connected with the light-emitting control terminal, and an output terminal thereof is connected with a second node which is a connection point of the light-emitting control module and the driving control module. An input terminal of the reset control module is connected with the second node, a control terminal thereof is connected with the reset control signal terminal, and an output terminal thereof is connected with the first node. A first terminal of the voltage stabilizing module is connected with the second reference signal terminal, and a second terminal thereof is connected with the first node. An input terminal of the driving control module is connected with the second node, a control terminal thereof is connected with the first node, and an output terminal thereof is connected with the anode layer of a corresponding one of the organic light-emitting devices. The cathode layer of each sub-pixel group is connected with the driving chip via a corresponding wire.

In some embodiments, the reset control module is configured, under control of the reset control signal terminal, to cause the first node to be in conduction with the second node. The light-emitting control module is configured, under control of the light-emitting control signal terminal, to supply the signal of the first reference signal terminal to the second node. The write compensating module is configured, under control of the write control signal terminal, to supply the signal of the data signal terminal and a preset threshold voltage to the first node. The preset threshold voltage has a difference from a threshold voltage of the driving control module in a preset range. The voltage stabilizing module is configured to perform charging or discharging according to a potential of the first node, and to maintain a voltage difference across the voltage stabilizing module to be a fixed value in response to the first node being in a floating state. The driving control module is configured, under joint control of the voltage stabilizing module and the light-emitting control module, to drive the organic light-emitting device to emit light.

In some embodiments, the driving chip is configured during a frame period to: output a light-emitting control signal to the light-emitting control signal terminal of the sub-pixel circuit of the sub-pixel and a reset control signal to the reset control signal terminal in a first phase; output a write control signal to the write control signal terminal and a data signal to the data signal terminal in a second phase; output a light-emitting control signal to the light-emitting control signal terminal in a third phase; and in a fourth phase that is the touch scanning phase, output to the signal terminals of the sub-pixel circuit and to the cathode layer of each sub-pixel group a superposition of respective signals output to the signal terminals and the cathode layer in the third phase with a same touch scanning signal, and determine a touch position by detecting a change in capacitance of the cathode layer via the corresponding wire. The driving chip outputs, from the first phase to the third phase, a first reference signal to the first reference signal terminal, a second reference signal to the second reference signal terminal, and a third reference signal to the cathode layer of the organic light-emitting device of the sub-pixel via the corresponding wire.

In some embodiments, the write compensating module comprises: a first switch transistor, a gate thereof being the control terminal of the write compensating module, a source thereof being the input terminal of the write compensating module, and a drain thereof being connected with a source of a first drive transistor; and a first drive transistor, a gate thereof being connected with a drain thereof to serve as the output terminal of the write compensating module, and a threshold voltage thereof being equal to the preset threshold voltage.

In some embodiments, the driving control module comprises a second drive transistor, a gate thereof being the control terminal of the driving control module, a drain thereof being the input terminal of the driving control module, and a source thereof being the output terminal of the driving control module.

In some embodiments, the reset control module comprises a second switch transistor, a gate thereof being the control terminal of the reset control module, a source thereof being the input terminal of the reset control module, and a drain thereof being the output terminal of the reset control module.

In some embodiments, the voltage stabilizing module comprises a capacitor, one terminal thereof being the first terminal of the voltage stabilizing module, and the other terminal thereof being the second terminal of the voltage stabilizing module.

In some embodiments, the light-emitting control module comprises a third switch transistor, a gate thereof being the control terminal of the light-emitting control module, a source thereof being the input terminal of the light-emitting control module, and a drain thereof being the output terminal of the light-emitting control module.

In some embodiments, a difference between the preset threshold voltage and the threshold voltage of the driving control module is less than 5% of the threshold voltage of the driving control module.

In some embodiments, the switch transistors are N-type transistors or P-type transistors.

In some embodiments, the sub-pixel circuit is located between the anode layer and the array substrate, the array substrate further comprises data lines for respectively connecting the data signal terminals in respective sub-pixel circuits with the driving chip, and the wire is disposed in the same layer as and insulated from the data lines.

In some embodiments, each transistor in the sub-pixel circuit includes an active layer, a gate insulating layer, a gate electrode, an insulating layer, a source electrode and a drain electrode that are located on the array substrate in turn, the source electrode and the drain electrode are disposed on the same layer as the data lines, and the wire is connected with a corresponding one of the cathode layers through a via.

In some embodiments, the in-cell touch screen panel further comprises a planarized layer located between a layer where the source electrode and the drain electrode is disposed and the anode layer, a sub-pixel limiting layer located between the cathode layer and the planarized layer and surrounding the light-emitting layer, and a cathode connecting portion disposed on the same layer as the anode layer. The cathode connecting portion is connected with the corresponding wire through a via running through the planarized layer, and the cathode layer is connected with the corresponding cathode connecting portion through a via running through the sub-pixel limiting layer.

In some embodiments, the plurality of sub-pixels are arranged regularly on the array substrate, each of which is of a hexagonal shape. The sub-pixels are arranged side by side in a row direction, and the sub-pixels at corresponding positions in every two adjacent rows are arranged staggered in a column direction. A via for connecting the cathode layer with the wire is arranged between every two adjacent sub-pixels in each row, and a via for connecting the anode layer with the drain electrode is arranged in a gap between two adjacent rows. Alternatively, the sub-pixels are arranged side by side in a column direction, and the sub-pixels at corresponding positions in every two adjacent columns are arranged staggered in a row direction. A via for connecting the cathode layer with the wire is arranged between every two adjacent sub-pixels in each column, and a via for connecting the anode layer with the drain electrode is arranged in a gap between two adjacent columns.

According to a second aspect of the present disclosure, a display device is further provided which comprises any one of the in-cell touch screen panels as described in the first aspect.

According to a third aspect of the present disclosure, a method of driving the in-cell touch screen panel as described in the first aspect is provided which comprises: outputting, by the driving chip during a frame period, signals to signal terminals of each sub-pixel circuit and to the cathode layer of each sub-pixel group. Each of the signals output in a touch scanning phase is a superposition of the signal output in a preceding phase with a touch scanning signal such that each sub-pixel circuit operates in the touch scanning phase in the same state as in the preceding phase.

In some embodiments, the sub-pixel circuit comprises a write compensating module, a voltage stabilizing module, a reset control module, a light-emitting control module, a driving control module, a data signal terminal, a write control signal terminal, a reset control signal terminal, a light-emitting control signal terminal, a first reference signal terminal and a second reference signal terminal. An input terminal of the write compensating module is connected with the data signal terminal, a control terminal thereof is connected with the write control signal terminal, and an output terminal thereof is connected with a first node which is a connection point of the write compensating module and the reset control module. An input terminal of the light-emitting control module is connected with the first reference signal terminal, a control terminal thereof is connected with the light-emitting control terminal, and an output terminal thereof is connected with a second node which is a connection point of the light-emitting control module and the driving control module. An input terminal of the reset control module is connected with the second node, a control terminal thereof is connected with the reset control signal terminal, and an output terminal thereof is connected with the first node. A first terminal of the voltage stabilizing module is connected with the second reference signal terminal, and a second terminal thereof is connected with the first node. An input terminal of the driving control module is connected with the second node, a control terminal thereof is connected with the first node, and an output terminal thereof is connected with the anode layer of a corresponding one of the organic light-emitting devices. The cathode layer of each sub-pixel group is connected with the driving chip via a corresponding wire. The method comprises the following steps. In a first phase of the frame period, the driving chip outputs a reset control signal to the reset control signal terminal, a light-emitting control signal to the light-emitting control signal terminal, a first reference signal to the first reference signal terminal, a second reference signal to the second reference signal terminal, and a third reference signal to the cathode layer of the organic light-emitting device through a corresponding wire, such that the light-emitting control module supplies the signal of the first reference signal terminal to the second node, the reset control module causes the first node to be in conduction with the second node, and the voltage stabilizing module begins to charge. In a second phase of the frame period, the driving chip outputs a write control signal to the write control signal terminal, a data signal to the data signal terminal, the first reference signal to the first reference signal terminal, the second reference signal to the second reference signal terminal, and the third reference signal to the cathode layer of the organic light-emitting device in the sub-pixels through the corresponding wire, such that the write compensating module supplies the signal of the data signal terminal and a preset threshold voltage to the first node, and the voltage stabilizing module begins to discharge. The preset threshold voltage has a difference from a threshold voltage of the driving control module in a preset range. In a third phase of the frame period, the driving chip outputs the light-emitting control signal to the light-emitting control signal terminal, the first reference signal to the first reference signal terminal, the second reference signal to the second reference signal terminal, and the third reference signal to the cathode layer of the organic light-emitting device in the sub-pixels through the corresponding wire, such that the first node is in a floating state, the voltage stabilizing module maintains a voltage difference thereacross at a fixed value, and the driving control module, under joint control of the voltage stabilizing module and the light-emitting control module, drives the organic light-emitting device to emit light. In a fourth phase of the frame period that is the touch scanning phase, the driving chip outputs to the signal terminals of the sub-pixel circuit and to the cathode layer of each sub-pixel group a superposition of respective signals output to the signal terminals and the cathode layer in the third phase with a same touch scanning signal, and determines a touch position by detecting a change in capacitance of the cathode layer via the corresponding wire.

In the in-cell touch screen panel, the driving method thereof and the display device according to embodiments of the present disclosure, one sub-pixel group is comprised of at least two sub-pixels, and cathode layers of different sub-pixel groups are independent of one another. This results from segmenting the cathode layer that is otherwise a whole surface in the prior art, and thus a sub-pixel group corresponds to a segment region in the segmented cathode layer. The cathode layer of each sub-pixel group is connected with the driving chip through the wire, which cathode layer is then reused as a self-capacitance touch electrode. The driving chip applies a touch scanning signal to the cathode layer via the wire, and determines a touch position by detecting a change in capacitance of the cathode layer via the conductive wire, thereby achieving touch control functionality. Furthermore, in the in-cell touch screen panel, each of the signals output by the driving chip to the signal terminals of the sub-pixel circuit and to the cathode layer in the fourth phase is a superposition of the signal output in the third phase with a touch scanning signal. This allows the sub-pixel circuit to operate in the same state as in the third phase (i.e., the light-emitting display phase). As such, where the touch screen panel is not touched by a human body, the capacitance provided by respective self-capacitance electrodes remains unchanged before and after application of the touch scanning signal, thereby ensuring accuracy of the touch position determination.

BRIEF DESCRIPTION OF THE DRAWINGS

FIG. 10 is a flow chart of a method of driving an in-cell touch screen panel according to an embodiment of the present disclosure.

DETAILED DESCRIPTION

Embodiments of the in-cell touch screen panel of the present disclosure, a driving method thereof and a display device are described below in detail with reference to the accompanying drawings.

The thickness and shape of the layers shown in the figures do not reflect actual proportions and are only intended to illustrate the content of the disclosure.

Figure 1:
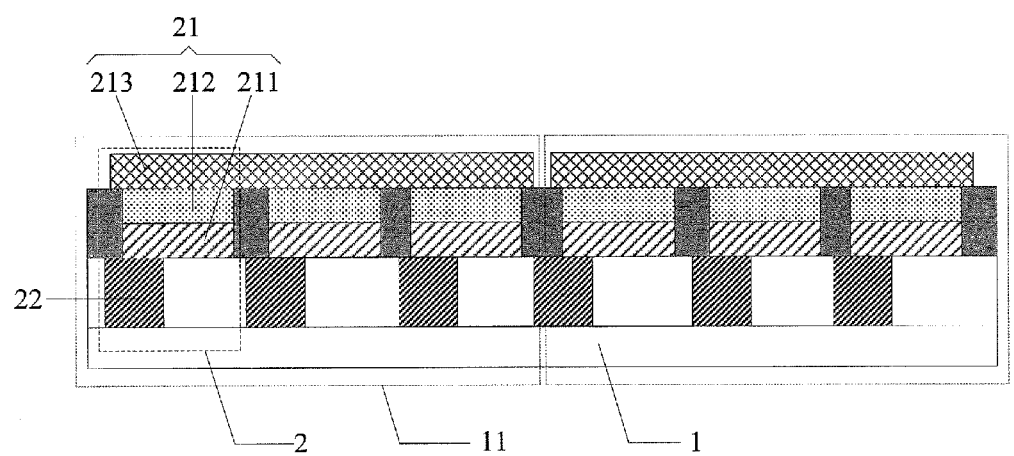
FIG. 1 is a structural schematic view of an in-cell touch screen panel according to an embodiment of the present disclosure.

FIG. 1 is a structural schematic view of an in-cell touch screen panel according to an embodiment of the present disclosure. As shown in FIG. 1, the in-cell touch screen panel includes an array substrate 1 and a plurality of sub-pixels 2 located on the array substrate 1. The sub-pixels 2 each comprise an organic light-emitting device 21 and a sub-pixel circuit 22 electrically connected with the organic light-emitting device 21 (the specific structure of the sub-pixel circuit is not shown in FIG. 1). The organic light-emitting device 21 comprises an anode layer 211, a light-emitting layer 213 and a cathode layer 213 that are located on the array substrate in turn. The sub-pixels 2 are grouped into sub-pixel groups each comprising at least two sub-pixels 2, and the cathode layers 213 belonging to different sub-pixel groups are independent of one another. The touch screen panel further comprises a driving chip (not shown in FIG. 1) for outputting signals to signal terminals of respective sub-pixel circuits 22 and the cathode layers 213 of the sub-pixel groups.

Figure 2:
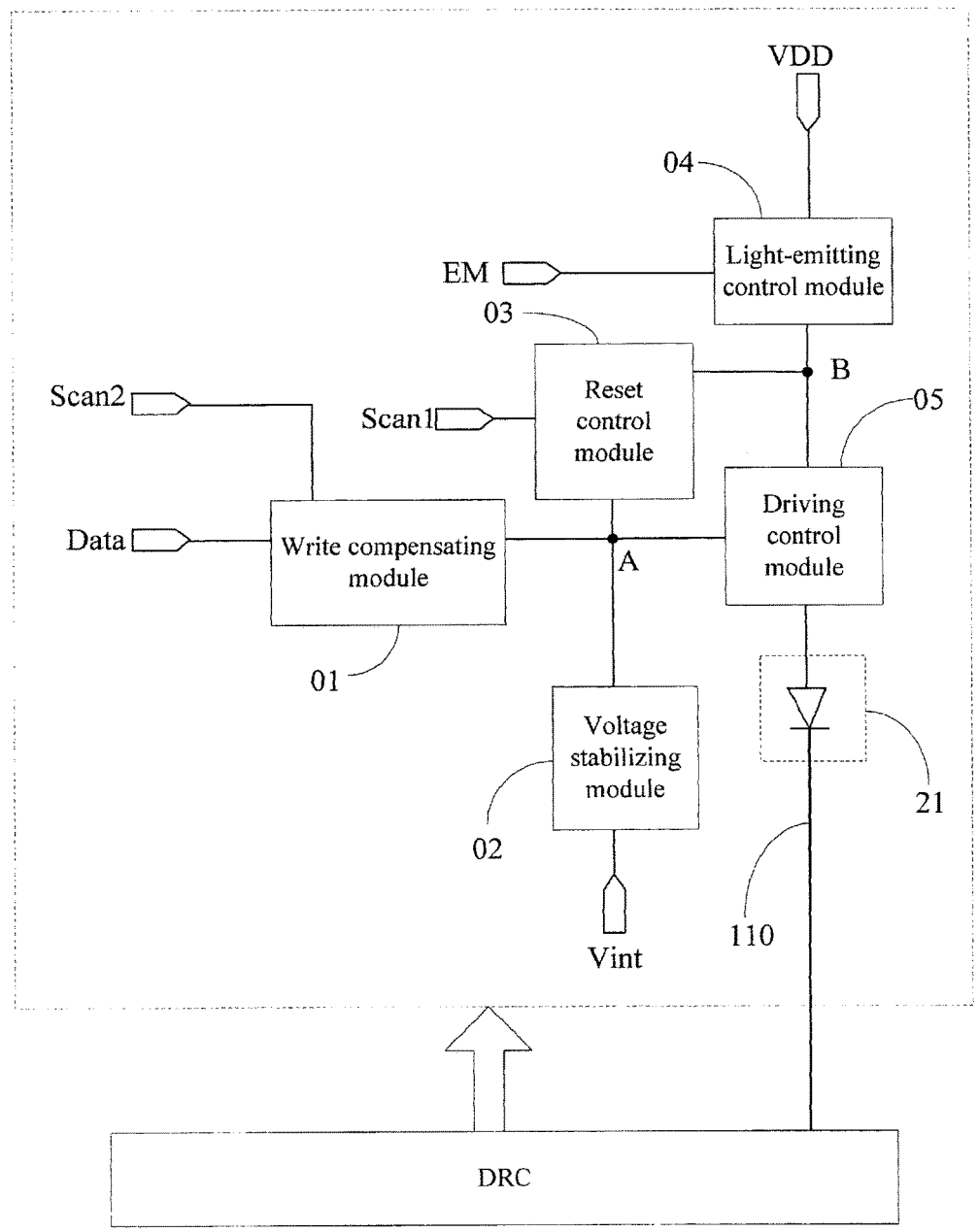
FIG. 2 is a structural schematic view of a sub-pixel circuit of an in-cell touch screen panel according to an embodiment of the present disclosure.

FIG. 2 is a structural schematic view of a sub-pixel circuit of an in-cell touch screen panel according to an embodiment of the present disclosure. As shown in FIG. 2, the sub-pixel circuits each comprise a write compensating module 01, a voltage stabilizing module 02, a reset control module 03, a light-emitting control module 04, a driving control module 05, a data signal terminal (i.e., Data), a write control signal terminal Scan2, a reset control signal terminal Scan1, a light-emitting control signal terminal EM, a first reference signal terminal VDD, and a second reference signal terminal Vint.

An input terminal of the write compensating module 01 is connected with the data signal terminal Data, a control terminal thereof is connected with the write control signal terminal Scan2, and an output terminal thereof is connected with a first node A. An input terminal of the light-emitting control module 04 is connected with the first reference signal terminal VDD, a control terminal thereof is connected with the light-emitting control terminal EM, and an output terminal thereof is connected with a second node B. An input terminal of the reset control module 03 is connected with the second node B, a control terminal thereof is connected with the reset control signal terminal Scan1, and an output terminal thereof is connected with the first node A. A first terminal of the voltage stabilizing module 02 is connected with the second reference signal terminal Vint, and a second terminal thereof is connected with the first node A. An input terminal of the driving control module is connected with the second node B, a control terminal thereof is connected with the first node A, and an output terminal thereof is connected with the anode layer 211 of a corresponding organic light-emitting device 21. The cathode layer 213 of each sub-pixel group 11 is connected with a driving chip DRC via a corresponding wire 110.

The reset control module 03 is configured, under control of the reset control signal terminal Scan1, to cause the first node A to be in conduction with the second node B. The light-emitting control module 04 is configured, under control of the light-emitting control signal terminal EM, to supply the signal of the first reference signal terminal VDD to the second node B. The write compensating module 01 is configured, under control of the write control signal terminal Scan2, to supply the signal of the data signal terminal Data and a preset threshold voltage to the first node A, wherein the preset threshold voltage has a difference from a threshold voltage of the driving control module 05 in a preset range. The voltage stabilizing module 02 is configured to perform charging or discharging according to a potential of the first node A, and to maintain a voltage difference across the voltage stabilizing module 02 to be a fixed value when the first node A is in a floating state. The driving control module 05 is configured, under joint control of the voltage stabilizing module 02 and light-emitting control module 04, to drive the organic light-emitting device 21 to emit light.

In operation, the signal terminals of the sub-pixel circuit and the cathode layer of the organic light-emitting device 21 receive signals from the driving chip DRC.

Figure 3:
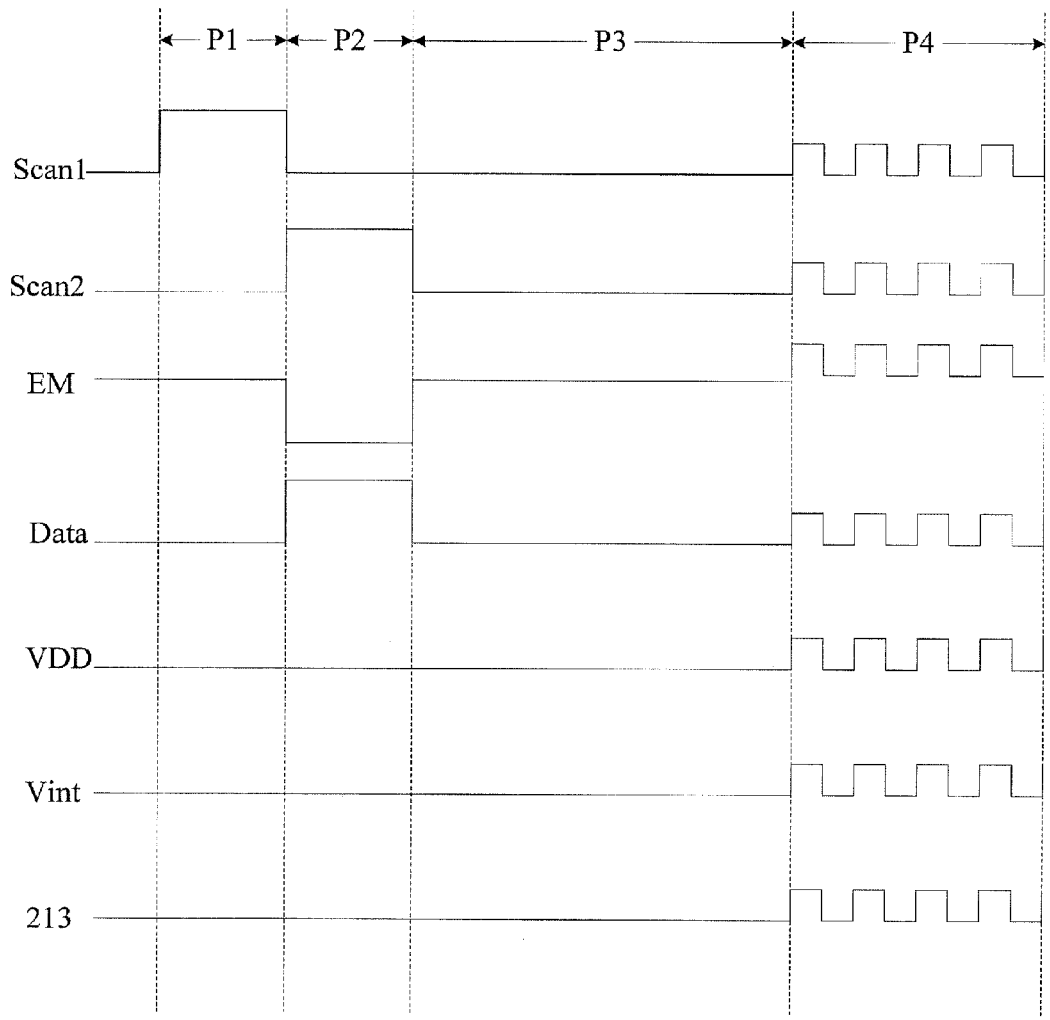
FIG. 3 is a schematic sequence diagram of signals output from a driving chip to signal terminals of a sub-pixel circuit and a cathode layer in a frame period.

FIG. 3 is a schematic sequence diagram of signals output from the driving chip to signal terminals of the sub-pixel circuit and the cathode layer in a frame period. As shown in FIG. 3, for each sub-pixel, the driving chip is configured to perform the following operations during a frame period. In a first phase P1, the driving chip outputs a light-emitting control signal to the light-emitting control signal terminal EM of the sub-pixel circuit 22 in the sub-pixel 2, and outputs a reset control signal to the reset control signal terminal Scan1. In a second phase P2, the driving chip outputs a write control signal to the write control signal terminal Scan2 and outputs a data signal to the data signal terminal Data. In a third phase P3, the driving chip outputs a light-emitting control signal to the light-emitting control signal terminal EM. From the first phase P1 to the third phase P3, the driving chip outputs a first reference signal to the first reference signal terminal VDD, outputs a second reference signal to the second reference signal terminal Vint, and outputs a third reference signal to the cathode layer 213 of the organic light-emitting device 21 in the sub-pixel 2 via the corresponding wire 110. In a fourth phase P4, the driving chip outputs signals to respective signal terminals (Scan1, Scan2, Vint, Data, EM and VDD) of the sub-pixel circuit 22 and the cathode layer 213, each of which signals is a superposition of the signal output in the third phase P3 with a touch scanning signal such that respective modules of the sub-pixel circuit 22 have the same operating state as that in the third phase P3. The touch scanning signal is shown as a square wave in the example of FIG. 3. Also, the driving chip detects a change in capacitance of the cathode layer 213 via the corresponding wire 110 to determine a touch position.

In the in-cell touch screen panel according to the embodiment of the present disclosure, the sub-pixels are grouped into sub-pixel groups each comprising at least two sub-pixels, and the cathode layers belonging to different sub-pixel groups are independent of one another. This results from segmenting the cathode layer that is otherwise a whole surface in the prior art, and thus a sub-pixel group corresponds to a segment region in the segmented cathode layer. The cathode layer of each sub-pixel group is connected with the driving chip through the wire, which cathode layer is then reused as a self-capacitance touch electrode. The driving chip applies a touch scanning signal to the cathode layer via the wire, and determines a touch position by detecting a change in capacitance of the cathode layer via the conductive wire, thereby achieving touch control functionality. Furthermore, in the in-cell touch screen panel, each of the signals output by the driving chip to the signal terminals of the sub-pixel circuit and to the cathode layer in the fourth phase is a superposition of this signal output in the third phase with a touch scanning signal. This allows the sub-pixel circuit to operate in the same state as in the third phase (i.e., the light-emitting display phase). As such, where the touch screen panel is not touched by a human body, the capacitance provided by respective self-capacitance electrodes remains unchanged before and after application of the touch scanning signal, thereby ensuring accuracy of the touch determination.

It is to be noted that in the in-cell touch screen panel according to the embodiment of the present disclosure, the operating state of a module refers to an ON state or OFF state of this module. Taking the light-emitting control module as an example, if the light-emitting control module is in an ON state in the third phase, and is also in the ON state in the fourth phase, then the operating state of the light-emitting control module in the fourth phase are the same as that in the third phase.

According to the principle of the self-capacitance touch control, when the touch screen panel is not touched by the human body, the capacitance of the self-capacitance electrodes is a fixed value. When the touch screen panel is touched by the human body, the capacitance of the corresponding self-capacitance electrodes is a superposition of the fixed value with a human body capacitance. A touch detection chip may determine the touch position in a touch time period by detecting a change in the capacitance of respective self-capacitance electrodes. In the in-cell touch screen panel, to ensure that the capacitance of respective self-capacitance electrodes (i.e., the cathode layers of respective sub-pixel groups) in the fourth phase is a fixed value, that is, kept fixed before and after application of the touch scanning signal, a voltage difference between each cathode layer and its corresponding ground electrode (i.e., other electrodes than the cathode layer) needs to remain consistent. To this end, in the embodiment of the present embodiment, each of the signals output by the driving chip to the signal terminals of the sub-pixel circuit and to the cathode layer in the fourth phase is a superposition of this signal output in the third phase with the touch scanning signal. This way, before and after application of the touch scanning signal, the capacitance of respective self-capacitance electrodes does not vary in the case that the touch screen panel is not touched by a human body. Thereby accuracy of touch position determination is ensured.

Furthermore, in the in-cell touch screen panel, by means of cooperation of modules of the sub-pixel circuit, the drive current generated when the organic light-emitting device emits light is mainly determined by a voltage of the data signal terminal, and is irrelevant to a threshold voltage of the driving control module. This can avoid the influence exerted by the threshold voltage of the driving control module on the current flowing through the organic light-emitting device, thereby enabling the working current of the drive light-emitting device to remain consistent, and thereby improving uniformity of brightness of the images in a display region of the display device.

It is to be noted that in the in-cell touch screen panel according to the embodiment of the present disclosure, the smaller the difference between the preset threshold voltage and the threshold voltage of the driving control module is, the smaller influence is exerted by a threshold voltage drift of the driving control module in the sub-pixel circuit on the current flowing through the organic light-emitting device. Theoretically, when the difference between the preset threshold voltage and the threshold voltage of the driving control module is 0, this influence can be avoided completely. However, due to factors such as manufacturing process, a difference of zero between the preset threshold voltage and the threshold voltage of the driving control module can generally not be achieved completely. In an embodiment, the difference between the preset threshold voltage and the threshold voltage of the driving control module may be less than 5% of the threshold voltage of the driving control module.

Figure 4:
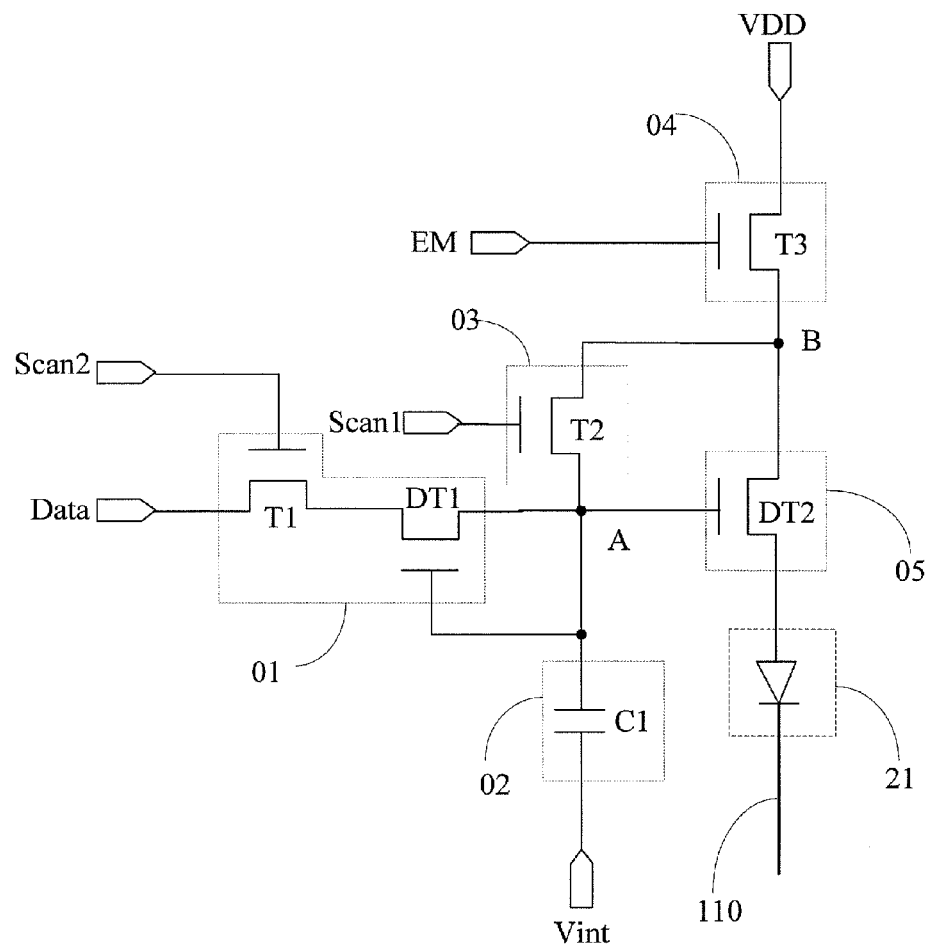
FIG. 4 is a specific structural schematic view of a sub-pixel circuit of an in-cell touch screen panel according to an embodiment of the present disclosure.

FIG. 4 is a specific structural schematic view of a sub-pixel circuit of an in-cell touch screen panel according to an embodiment of the present disclosure. As shown in FIG. 4, the write compensating module 01 may specifically comprise a first switch transistor T1 and a first drive transistor DT1. A gate of the first switch transistor T1 is the control terminal of the write compensating module 01, a source thereof is the input terminal of the write compensating module 01, and a drain thereof is connected with a source of the first drive transistor DT1. In an embodiment, the first switch transistor may be an N-type transistor or a P-type transistor. A gate of the first drive transistor DT1 is connected with a drain thereof to serve as an output terminal of the write compensating module 01, and a threshold voltage $V_{th1}$ of the first drive transistor DT1 is equal to the preset threshold voltage. When the first switch transistor T1 is in the ON state under control of the write control signal terminal Scan2, the signal of the data signal terminal Data is supplied to the source of the first drive transistor DT1 through the first switch transistor T1. Since the first drive transistor DT1 is connected as a diode structure, the signal of the source of the first drive transistor DT1 flows towards the first node A via the diode structure that is now in an ON state. Since the threshold voltage $V_{th1}$ of the first drive transistor DT1 is the preset threshold voltage, the voltage of the first node A is now a sum of the voltage of the signal of the data signal terminal and the preset threshold voltage.

The driving control module 05 may specifically comprise a second drive transistor DT2. A gate of the second drive transistor DT2 is the control terminal of the driving control module 05, a drain thereof is the input terminal of the driving control module 05, and a source thereof is the output terminal of the driving control module 05. In an embodiment, the type of the first drive transistor DT1 is identical with the type of the second drive transistor DT2, both of which are generally N-type. Since the threshold voltage of the N-type transistor is generally positive, the corresponding first reference signal is generally a positive voltage, and the third reference signal received by the cathode layer is generally grounded or negative. In an embodiment, to enable the threshold voltage of the first drive transistor to approximate the threshold voltage of the second drive transistor, the first drive transistor has a size and a shape that are both identical with those of the second drive transistor, and the first drive transistor is positioned close to the second drive transistor.

The reset control module 03 may specifically comprise a second switch transistor T2. A gate of the second switch transistor T2 is the control terminal of the reset control module 03, a source thereof is the input terminal of the reset control module 03, and a drain thereof is the output terminal of the reset control module 03. In an embodiment, the second switch transistor may be an N-type transistor or a P-type transistor. When the second switch transistor T2 is in an ON state under control of the reset control signal terminal Scan1, the second switch transistor T2 in the ON state causes the first node A to be in conduction with the second node B.

The voltage stabilizing module 02 may specifically comprise a capacitor C1. One terminal of the capacitor C1 is the first terminal of the voltage stabilizing module 02, and the other terminal of the capacitor C1 is the second terminal of the voltage stabilizing module 02. When the potential of the first node A is higher than that in a preceding time period, the capacitor C1 begins to charge. When the potential of the first node A is lower than that in a preceding time period, the capacitor C1 begins to discharge. When the first node A is in a floating state (i.e., none of the write compensating module 01 and the reset control module 03 outputs signal to the first node A), a fixed voltage difference is maintained across the capacitor C1.

Furthermore, in the in-cell touch screen panel according to the embodiment of the present disclosure, from the first phase to the third phase, the voltage of the second reference signal terminal may be identical with the voltage of the cathode layer. However, the present disclosure is not so limited.

The light-emitting control module 04 may specifically comprise a third switch transistor T3. A gate of the third switch transistor T3 is the control terminal of the light-emitting control module 04, a source thereof is the input terminal of the light-emitting control module 04, and a drain thereof is the output terminal of the light-emitting control module 04. In an embodiment, the third switch transistor may be an N-type transistor or a P-type transistor. When the third switch transistor T3 is in an ON state under control of the light-emitting control signal terminal EM, a signal at the first reference signal terminal VDD is transmitted to the second node B through the third switch transistor T3 that is in the ON state.

By way of example, the drive transistors and the switch transistors described above may be thin film transistors (TFT), or metal oxide semiconductor field effect transistors (MOSFET). In some embodiments, to simplify the manufacturing process, all switch transistors are N-type transistors or P-type transistors. In some embodiments, since the first drive transistor and the second drive transistor are N-type transistors, all switch transistors may also be designed as N-type transistors (i.e., all transistors are N-type transistors). This way, the manufacturing process of the sub-pixel circuit may be simplified.

The specific structures of the sub-pixel circuit in the in-cell touch screen panel are described only for purposes of illustration, not for limitation. The present disclosure is not limited to the described specific structures.

The operating procedure of the sub-pixel circuit according to the embodiment of the present disclosure will be described by taking the sub-pixel circuit shown in FIG. 4 as an example. The corresponding sequence diagram of the input signals is shown in FIG. 3. In the sub-pixel circuit, all drive transistors (DT1 and DT2) and all switch transistors (T1, T2 and T3) are N-type transistors. The N-type transistor is in an ON state when the gate is at a high level and in an OFF state when the gate is at a low level. For ease of description, a high level signal is hereinafter represented with "1", and a low level signal is represented with "0". In addition, assume that from the first phase to the third phase, the potential of the first reference signal output by the driving chip to the first reference signal terminal VDD is $V_{dd}$, the potential of the second reference signal output to the second reference signal terminal Vint is $V_{ss}$, the potential of the third reference signal output to the cathode layer 213 is $V_{ss}$, and in the fourth phase, an amplitude of the superposed touch scanning signal is $|\Delta V|$.

FIGS. 5a-5d are diagrams of operating states of the sub-pixel circuit of FIG. 4 in different phases. In these figures, a dashed circle superimposed on a transistor indicates that this transistor is in an OFF state.

Figure 5A:
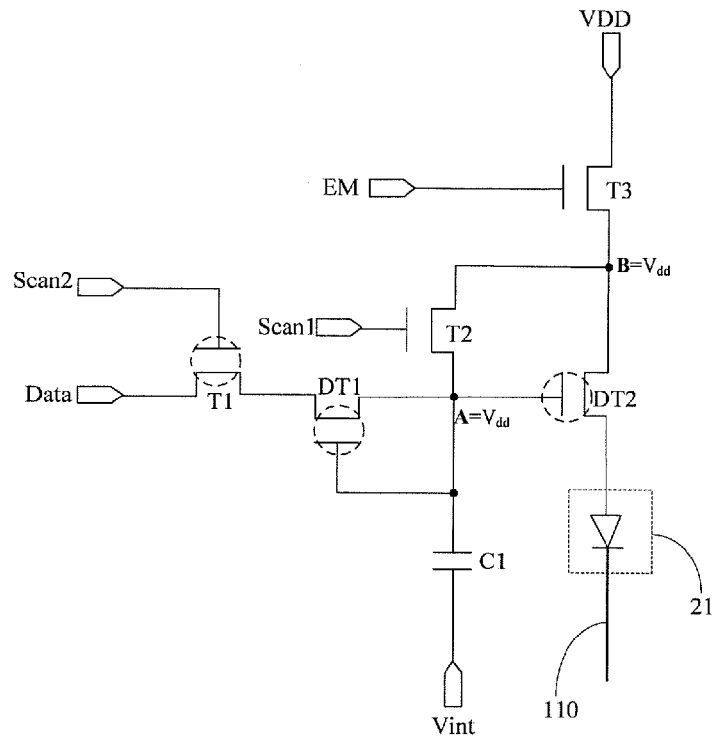
FIGS. 5a-5d are diagrams of operating states of the sub-pixel circuit of FIG. 4 in different phases.

In the first phase P1 (reset charge phase), Scan1=1, Scan2=0, and EM=1. As shown in FIG. 5a, the second switch transistor T2 and the third switch transistor T3 are in an ON state, and the first switch transistor T1, the first drive transistor DT1 and the second drive transistor DT2 are in an OFF state. The first reference signal of the first reference signal terminal VDD is transmitted to the second node B through the ON third switch transistor T3 so that the potential of the second node B is the potential $V_{dd}$ of the first reference signal. The signal of the second node B is transmitted to the first node A through the ON second switch transistor T2, so that the potential of the first node A is also the potential $V_{dd}$ of the first reference signal, and the potential of the second reference signal terminal Vint is the potential $V_{ss}$ of the second reference signal. The capacitor C1 begins to charge.

In a second phase P2 (write compensating phase), Scan1=0, Scan2=1, and EM=0.

Figure 5B:
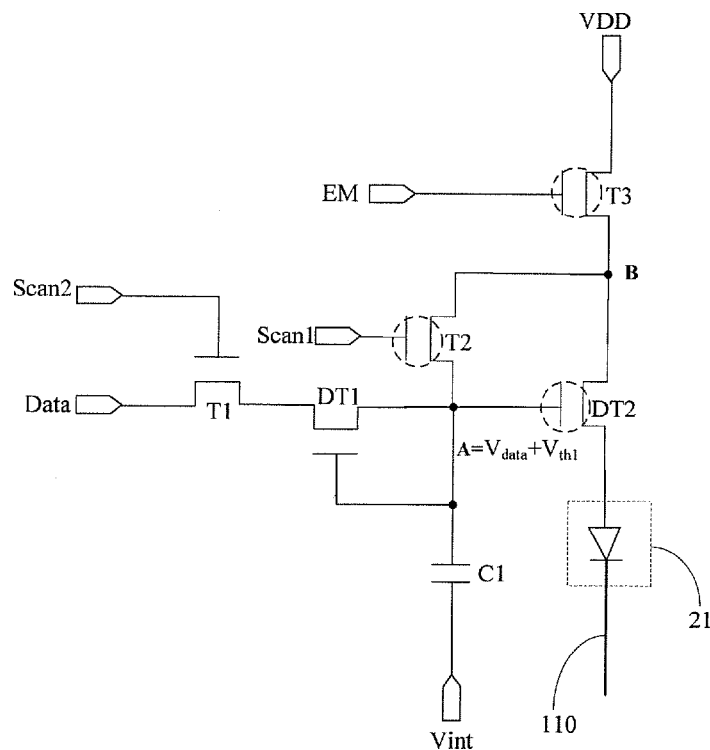

As shown in FIG. 5b, the first switch transistor T1 and the first drive transistor DT1 are in an ON state, and the second switch transistor T2, the third switch transistor T3 and the second drive transistor DT2 are in an OFF state. The data signal of the data signal terminal Data is transmitted to the source of the first drive transistor DT1 through the ON first switch transistor T1, so that the potential of the source of the first drive transistor DT1 is a potential $V_{data}$ of the data signal. Then, the signal of the source of the first drive transistor DT1 passes through the first drive transistor DT1 of the diode structure and then is transmitted to the first node A. The capacitor C1 begins to discharge. When the potential of the first node A becomes $V_{data}+V_{th1}$ (where $V_{th1}$ is a threshold voltage of the first drive transistor DT1), the capacitor C1 stops discharging.

In a third phase P3 (light-emitting display phase), Scan1=0, Scan2=0, and EM=1.

Figure 5C:
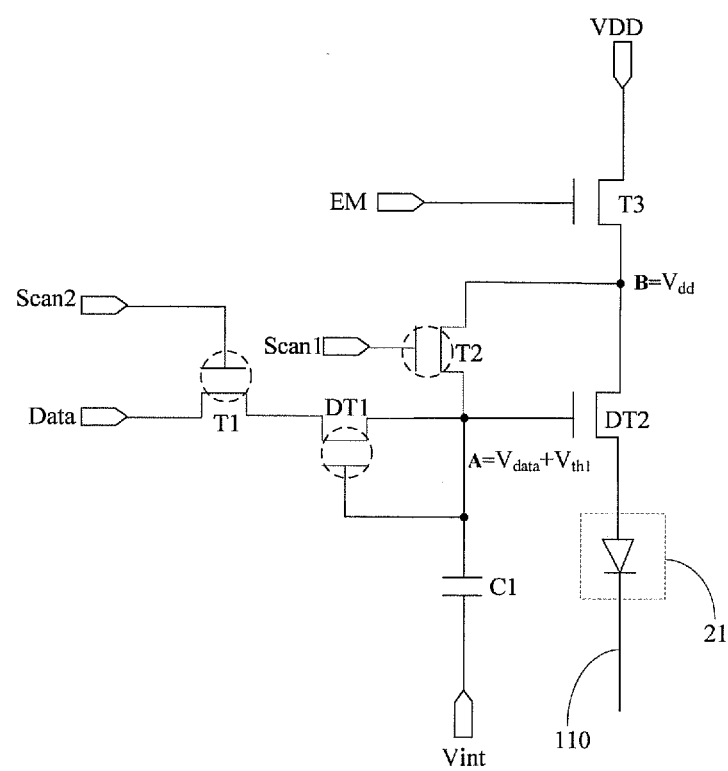

As shown in FIG. 5c, the third switch transistor T3 and the second drive transistor DT2 are in an ON state, the first switch transistor T1, the second switch transistor T2 and the first drive transistor DT1 are in an OFF state. The first node A is in a floating state. The first reference signal of the first reference signal terminal VDD is transmitted to the second node B through the ON third switch transistor T3 so that the potential of the second node B becomes the potential $V_{dd}$ of the first reference signal. Since the first node A is in a floating state, the capacitor C1 enables the potential of the first node A to remain at the potential $V_{data}+V_{th1}$ of the preceding phase. In this phase, the second drive transistor DT2 operates in a saturated state. According to the current properties of the saturated state, a working current $I_{OLED}$ flowing through the second drive transistor DT2 for driving the organic light-emitting device 21 to emit light satisfies the following equation:

$$I_{OLED}=K(V_{gs}-V_{th2})^2=K[V_{data}+V_{th1}-V_{oled}-V_{th2}]^2=K(V_{data}-V_{oled}+V_{th1}-V_{th2})^2,$$

where K is a structural parameter that is relatively stable in the same structure and may be considered constant, $V_{th2}$ is the threshold voltage of the second drive transistor DT2, and $V_{oled}$ is the voltage of the anode layer of the organic light-emitting device 21.

Since a difference between the threshold voltage $V_{th1}$ of the first drive transistor DT1 and the threshold voltage V of the second drive transistor DT2 is small and thus $V_{th1}-V_{th2}$ has a small influence on the $I_{OLED}$, a drift of the threshold voltage of the first drive transistor DT1 may be compensated through the first drive transistor DT1. Further, assume that the difference between the threshold voltage $V_{th1}$ of the first drive transistor DT1 and the threshold voltage V of the second drive transistor DT2 is neglectable, i.e., $V_{th1}-V_{th2}$ is approximately equal to 0 relative to $V_{data}-V_{oled}$, then $I_{OLED}=K(V_{data}-V_{oled})^2$. It can be seen that the working current $I_{OLED}$ of the organic light-emitting device 21 is no longer influenced by the threshold voltage $V_{th2}$ of the second drive transistor DT2, but is mainly dependent on the data signal. This thoroughly solves the influence exerted by the threshold voltage drift of the drive transistor due to the manufacturing process and long-term operation on the working current of the organic light-emitting device, and thereby improves uniformity of the display of the panel.

In a fourth phase P4 (touch display phase), Scan1=0, Scan2=0, and EM=1.

Since each of the signals of the signal terminals of the sub-pixel circuit and the cathode layer 213 is a superposition of the signal output in the third phase P3 with the touch scanning signal, the modules of the sub-pixel circuit operate in the same state as in the third phase, i.e., a relative potential between the signals is still identical with that in the third phase. In the fourth phase, Scant is still a low level signal, Scan2 is still a low level signal, and EM is still a high level signal.

Figure 5D:
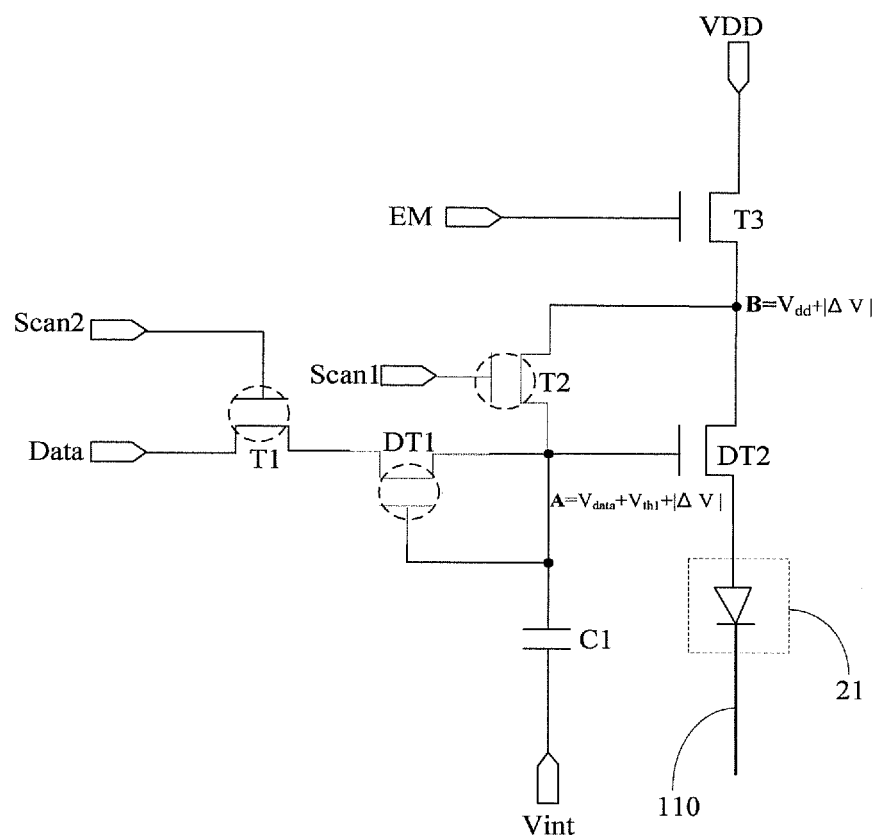

Hence, as shown in FIG. 5d, the third switch transistor T3 and the second drive transistor DT2 are in an ON state, and the first switch transistor T1, second switch transistor T2 and the first drive transistor DT1 are in an OFF state. The first node A is in a floating state. The signal of the first reference signal terminal VDD is transmitted to the second node B via the ON third switch transistor T2 so that the potential of the second node B changes from $V_{dd}$ of the third phase P3 to $V_{dd}+|\Delta V|$, and the potential of the cathode layer of the organic light-emitting device 21 changes from $V_{ss}$ of the third phase P3 to $V_{ss}+|\Delta V|$. Accordingly, the potential of the anode layer of the organic light-emitting device 21 changes from $V_{oled}$ of the third phase P3 to $V_{oled}+|\Delta V|$, and the potential of the terminal of the capacitor C1 which is connected with the second reference signal terminal Vint also changes from $V_{ss}$ of the third phase P3 to $V_{ss}+|\Delta V|$. Since the first node A is in a floating state in this phase, to keep the voltage difference across the capacitor C1 unchanged, the potential of the first node A transits from $V_{data}+V_{th1}$ of the third phase P3 to $V_{data}+V_{th1}+|\Delta V|$. In this phase, the second drive transistor DT2 operates in a saturated state. According to the current properties of the saturated state, a working current $I_{OLED}$ flowing through the second drive transistor DT2 for driving the organic light-emitting device 21 to emit light satisfies the following equation:

$$I_{OLED}=K(V_{gs}-V_{th2})^2=K[V_{data}+V_{th1}+|\Delta V|-V_{oled}-|\Delta V|-V_{th2}]^2=K(V_{data}-V_{oled}+V_{th1}-V_{th2})^2.$$

It can be seen that the working current $I_{OLED}$ of the organic light-emitting device 21 is consistent with that in the third phase P3, and the touch scanning signal $|\Delta V|$ superposed on respective signal terminals of the sub-pixel circuit and the cathode layer does not have an influence on the working current $I_{OLED}$ of the organic light-emitting device 21.

Moreover, in this phase, the cathode layer is reused as a self-capacitance electrode, and the driving chip determines a touch position by detecting a change in capacitance of the cathode layer. Since the respective signals of the cathode layer and the signal terminals of the sub-pixel circuit are all superposed with the same touch scanning signal, it may be ensured that the capacitance of the cathode layer (i.e., the self-capacitance electrode) is a fixed value before and after application of the touch scanning signal. Thereby accuracy of the touch position determination is ensured.

The above embodiment is described by way of example where all drive transistors and all switch transistors of the sub-pixel circuit are N-type transistors. Of course, in other embodiments, all switch transistors may be P-type transistors. Alternatively, a portion of the switch transistors may be N-type transistors and the remaining portion are P-type transistors.

FIGS. 6a-6e are specific structural schematic views of sub-pixel circuits of in-cell touch screen panels according to further embodiments of the present disclosure, and FIGS. 7a-7e are schematic sequence diagrams of corresponding input signals of the sub-pixel circuits as shown in FIGS. 6a-6e.

Figure 6A:
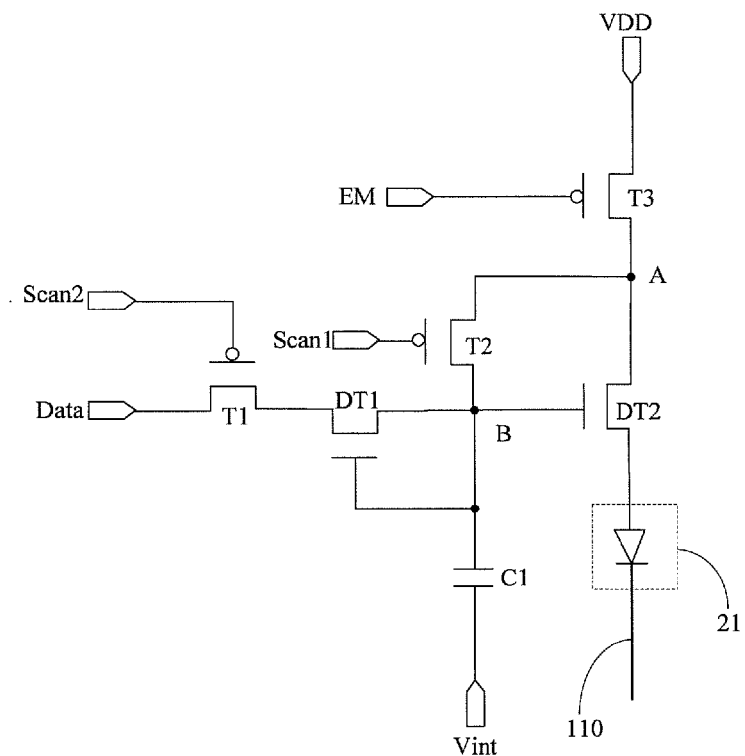
FIGS. 6a-6e are specific structural schematic views of sub-pixel circuits of in-cell touch screen panels according to further embodiments of the present disclosure.
Figure 7A:
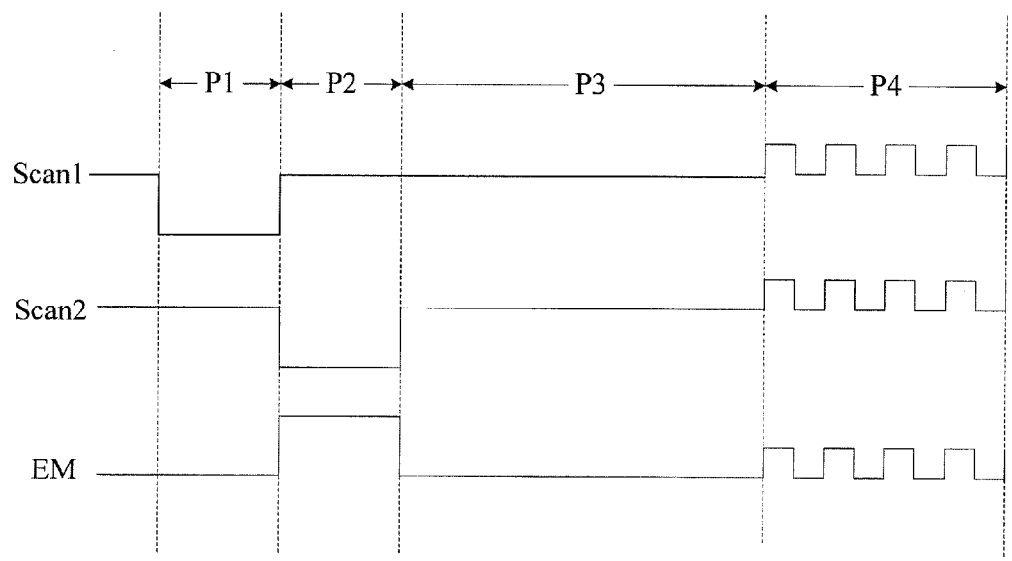
FIGS. 7a-7e are schematic sequence diagrams of corresponding input signals of the sub-pixel circuits as shown in FIGS. 6a-6e.

As shown in FIG. 6a, both the first drive transistor DT1 and the second drive transistors DT2 are N-type transistors, and the first switch transistor T1, the second switch transistor T2 and the third switch transistor T2 are P-type transistors. The corresponding sequence diagram of the input signals is shown in FIG. 7a. The working principle of the sub-pixel circuit is identical with that in the above embodiment, and will not be detailed here.

Figure 6B:
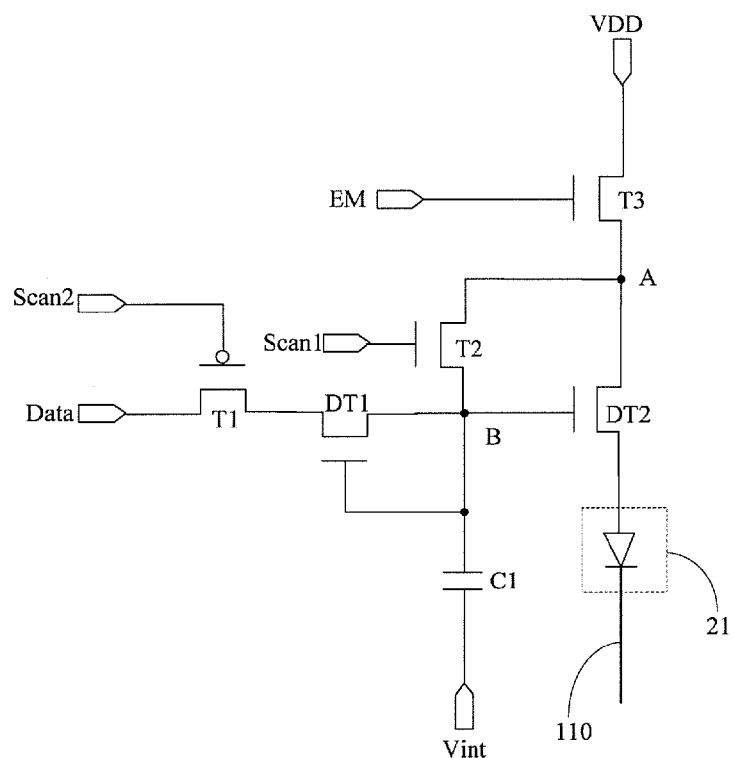
Figure 7B:
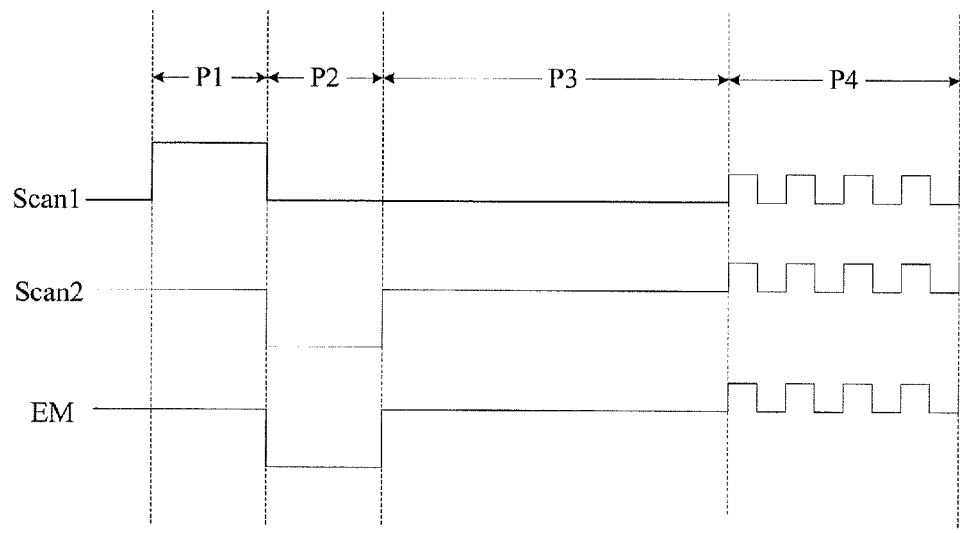

As shown in FIG. 6b, both the first drive transistor DT1 and the second drive transistor DT2 are N-type transistors, the first switch transistor T1 is a P-type transistor, and both the second switch transistor T2 and third switch transistor T3 are N-type transistors. The corresponding sequence diagram of the input signals is shown in FIG. 7b. The working principle of the sub-pixel circuit is identical with that in the above embodiment, and will not be detailed here.

Figure 6C:
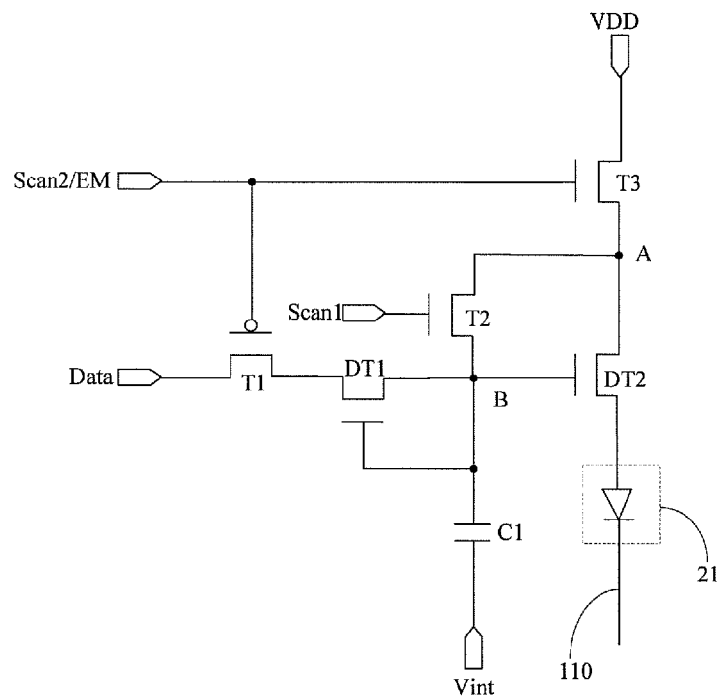
Figure 7C:
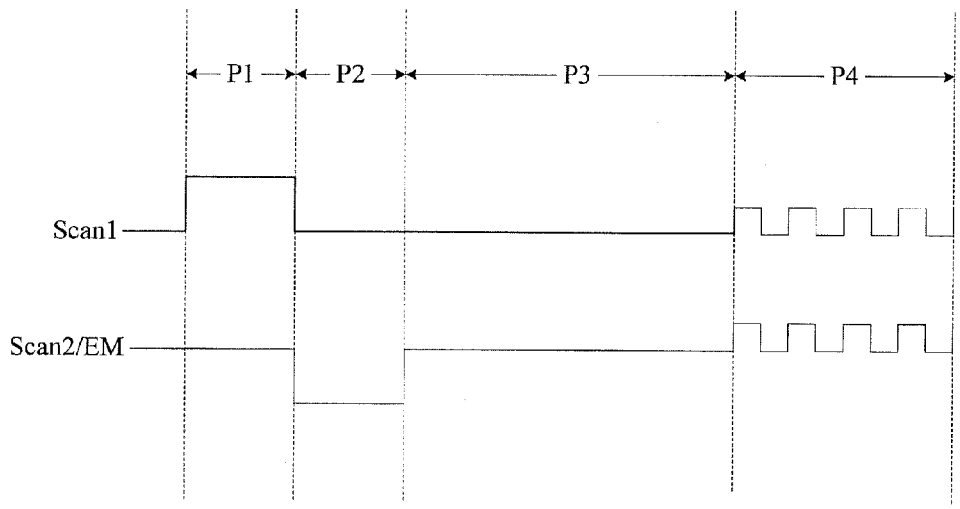

Further, as can be seen from the sequence diagram as shown in FIG. 7b, the signal of the light-emitting control signal terminal EM has the same waveform as the signal of the write control signal terminal Scan2, so the light-emitting control signal terminal EM and the write control signal terminal Scan2 can be connected together as a same terminal. The structure of such a sub-pixel circuit is shown in FIG. 6c. The corresponding sequence diagram of the input signals is shown in FIG. 7c. The working principle of the sub-pixel circuit is identical with that in the above embodiment, and will not be detailed here.

Figure 6D:
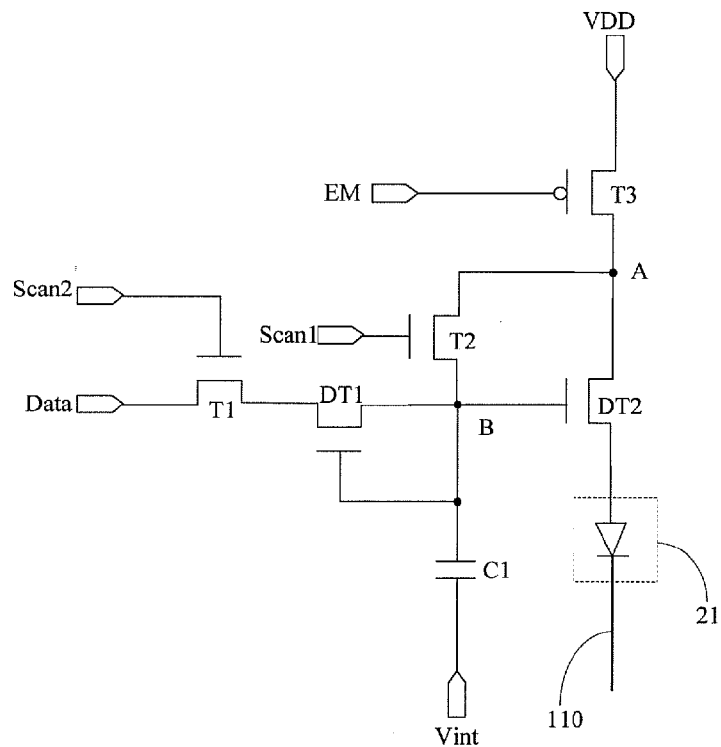
Figure 7D:
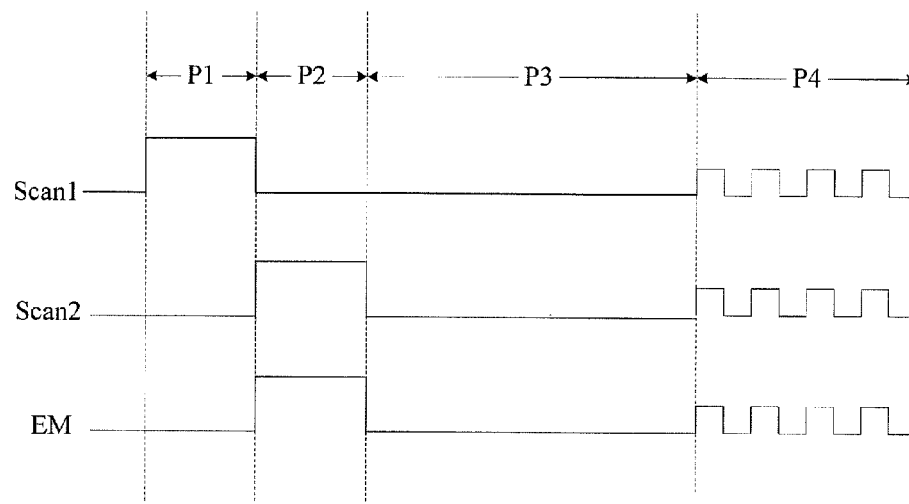

As shown in FIG. 6d, both the first drive transistor DT1 and the second drive transistor DT2 are N-type transistors, the first switch transistor T1 and the second switch transistor T2 are N-type transistors, and the third switch transistor T3 is a P-type transistor. The corresponding sequence diagram of the input signals is shown in FIG. 7d. The working principle of the sub-pixel circuit is identical with that in the above embodiment, and will not be detailed here.

Figure 6E:
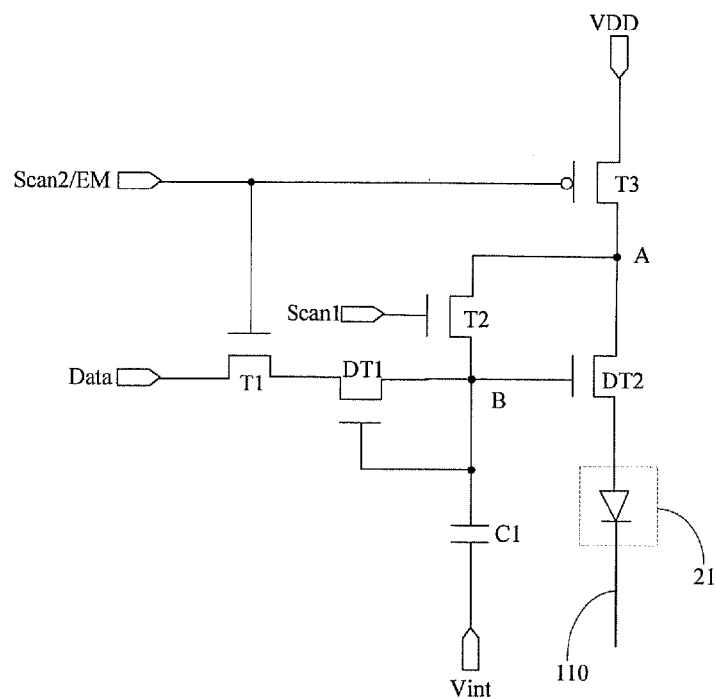
Figure 7E:
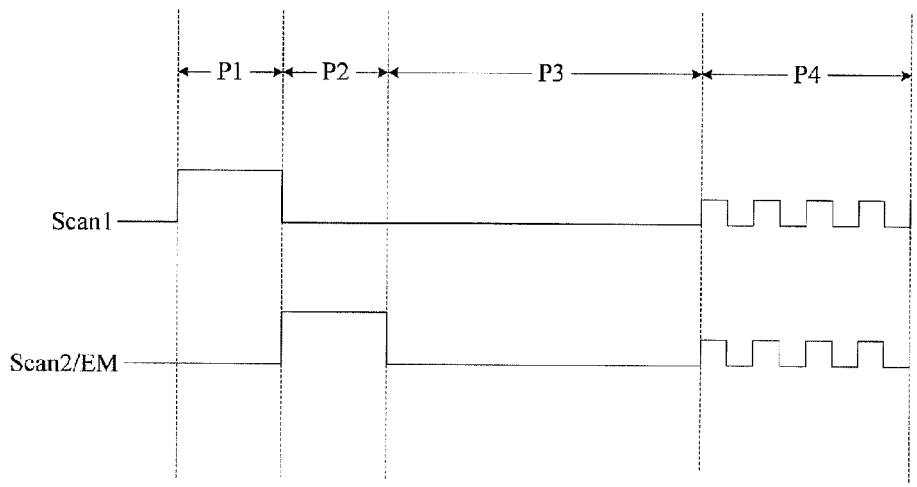

Further, as can be seen from the sequence diagram as shown in FIG. 7d, the signal of the light-emitting control signal terminal EM has the same waveform as the signal of the write control signal terminal Scan2, so the light-emitting control signal terminal EM and the write control signal terminal Scan2 can be connected together as a same terminal. The structure of such a sub-pixel circuit is as shown in FIG. 6e. The corresponding sequence diagram of the input signals is shown in FIG. 7e. The working principle of the sub-pixel circuit is identical with that in the above embodiment, and will not be detailed here.

It is to be noted that in the sub-pixel circuits as shown in FIGS. 6a to 6e, the waveform sequences of the signals of the first reference signal terminal VDD, the second reference signal terminal Vint, the data signal terminal Data and the cathode layer 213 are all identical with that of the sub-pixel circuit as shown in FIG. 4. Thus, in FIGS. 7a to 7e, only the waveform sequences of the signals of the reset control signal terminal Scan1, the write control signal terminal Scan2 and the light-emitting control signal terminal EM are shown.

In the in-cell touch screen panel according to the embodiment of the present disclosure, the sub-pixel circuit is generally located between the anode layer and the array substrate. To simplify the manufacturing process, the wire connected with the cathode layer may be fabricated on the same layer as the sources, gates or drains of the transistors in the sub-pixel circuit or other signal lines on the array substrate. This way, no new fabrication process needs to be added, except that patterning of the corresponding layers is to be altered. Thereby, the process is simplified, the production cost is saved, and the production efficiency is improved.

In some embodiments, the sub-pixel circuit is located between the anode layer and the array substrate. The array substrate further comprises data lines for connecting the data signal terminals in respective sub-pixel circuits with the driving chip respectively. The wire is disposed in the same layer as and insulated from the data lines.

In some embodiments, all transistors in the sub-pixel circuit each include an active layer, a gate insulating layer, a gate electrode, an inter-layer insulating layer, a source electrode and a drain electrode that are located on the array substrate in turn. The data lines, the source electrode and the drain electrode are disposed on the same layer, and the wire is connected with the corresponding cathode layer through a via.

In some embodiments, the in-cell touch screen panel further comprises a planarized layer located between the layer where the source electrode and the drain electrode is disposed and the anode layer, a sub-pixel limiting layer located between the cathode layer and the planarized layer and surrounding light-emitting layers, and a cathode connecting portion disposed on the same layer as the anode layer. The cathode connecting portion is connected with the corresponding wire through a via running through the planarized layer, and the cathode layer is connected with the corresponding cathode connecting portion through a via running through the sub-pixel limiting layer.

In some embodiments, the in-cell touch screen panel further comprises a buffering layer located between the sub-pixel circuit and the array substrate.

Figure 8:
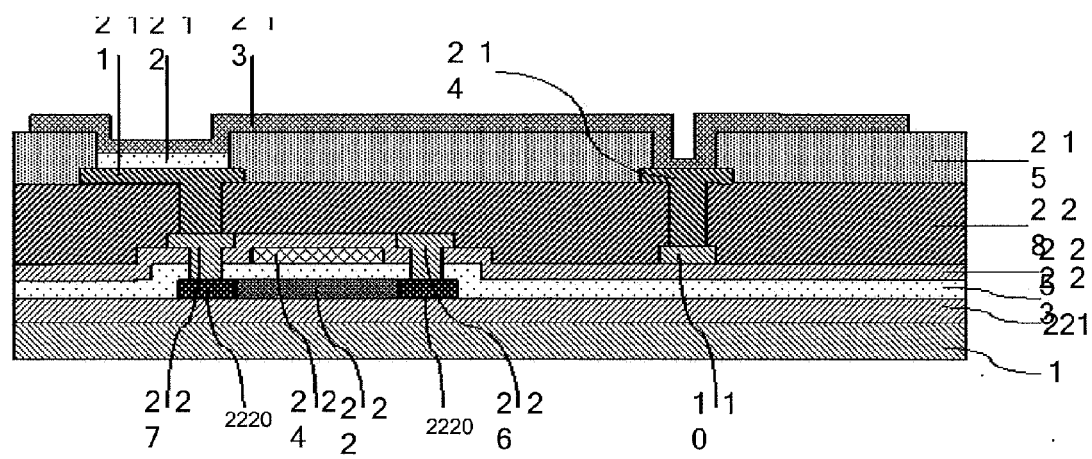
FIG. 8 is a structural schematic view of a portion of an in-cell touch screen panel according to an embodiment of the present disclosure.

FIG. 8 is a structural schematic view of a portion of an in-cell touch screen panel according to an embodiment of the present disclosure. Taking one sub-pixel as an example, as shown in FIG. 8, the array substrate 1 is provided in turn with a buffering layer 221, an active layer 222, a gate insulating layer 223, a gate electrode 224, an inter-layer insulting layer 225, a source electrode 226, a drain electrode 227, a wire 110, a planarized layer 228, an anode layer 211, a cathode connecting portion 214, a light-emitting layer 212, a sub-pixel limiting layer 215 surrounding the light-emitting layer 212, and a cathode layer 213. The source electrode 226, the drain electrode 227, and the wire 110 are disposed on the same layer.

The cathode layer 213 is connected with the cathode connecting portion 214 through a via running through the sub-pixel limiting layer 215. The anode layer 211 is connected with the drain electrode 227 through a via running through the planarized layer 228. The cathode connecting portion 214 is connected with the wire 110 through a via running through the planarized layer 228. The source electrode 226 and the drain electrode 227 are connected with the active layer 222 respectively through vias running through the inter-layer insulating layer 225 and the gate insulating layer 223. The active layer 222 is dope-treated in regions 2220 that are in contact with the source electrode 226 and the drain electrode 227. Only the active layer 222, the gate electrode 224, the source electrode 226 and the drain electrode 227 of the second drive transistor DT2 are shown in FIG. 8. The configuration of the switch transistor may be similar to that of the drive transistor and thus will not be detailed here.

Figure 9A:
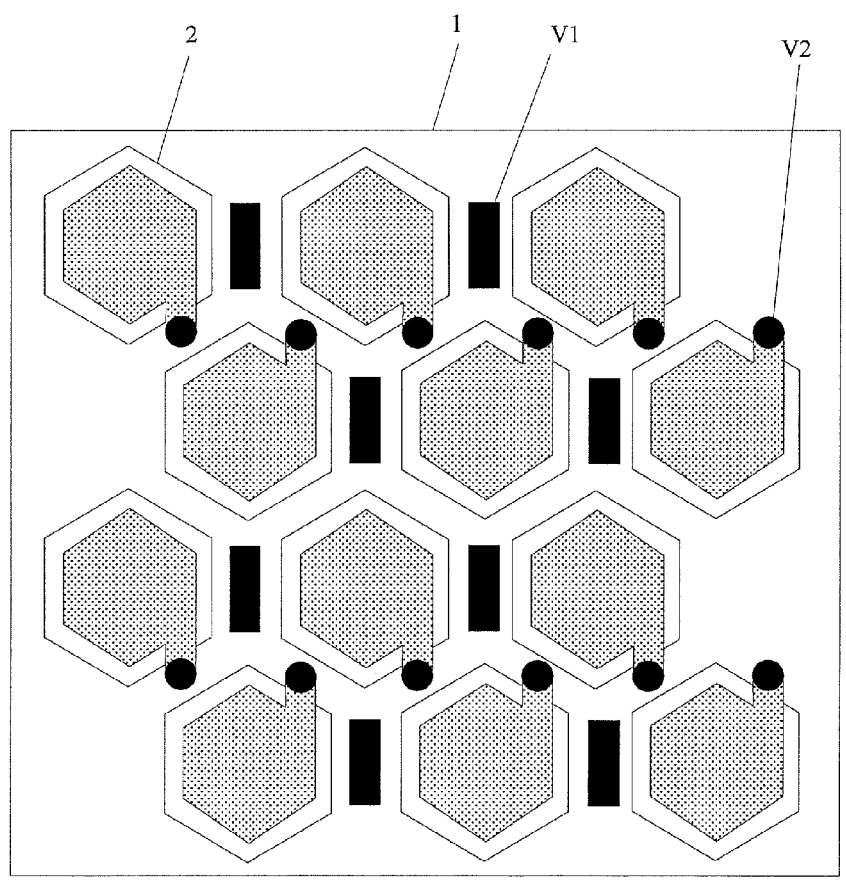
FIGS. 9a and 9b are schematic views of arrangement of sub-pixels of an in-cell touch screen panel according to an embodiment of the present disclosure.
Figure 9B:
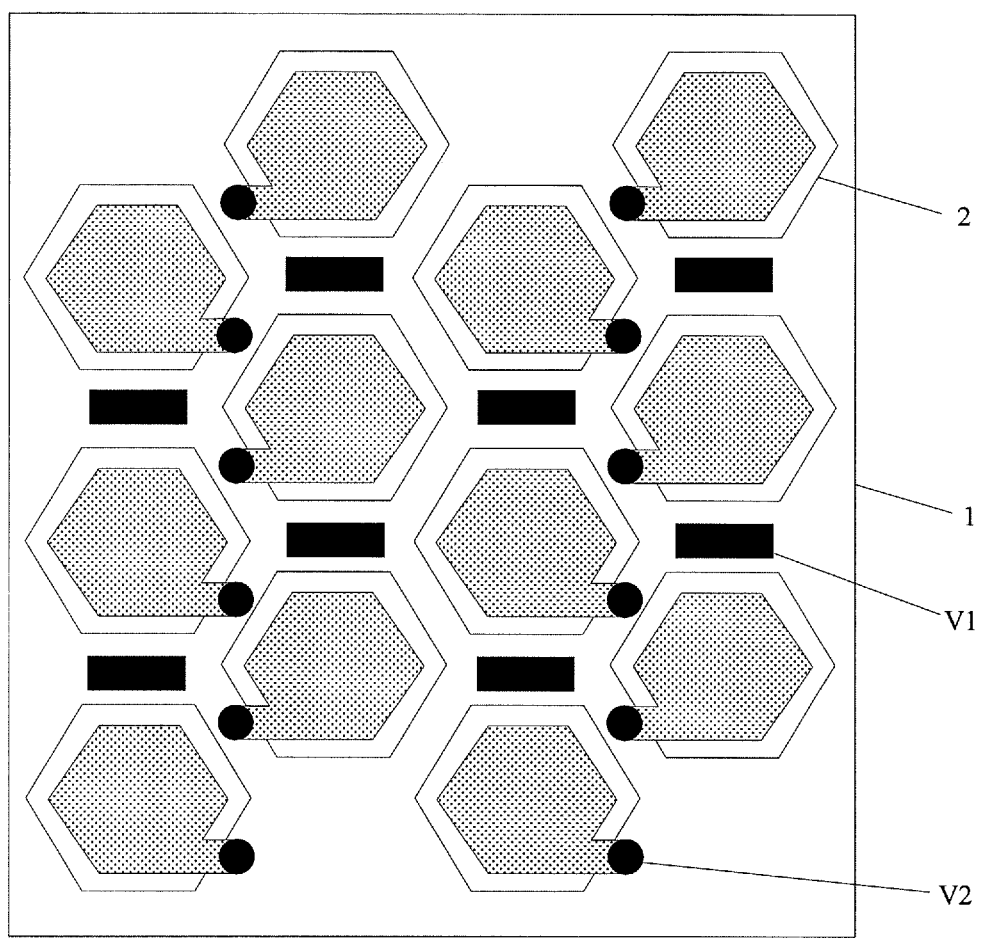

FIGS. 9a and 9b are schematic views of arrangement of sub-pixels of an in-cell touch screen panel according to an embodiment of the present disclosure. As shown in FIG. 9a and FIG. 9b, each sub-pixel 2 is of a hexagonal shape, and the sub-pixels 2 are arranged regularly on the array substrate 1. Specifically, as shown in FIG. 9a, sub-pixels 2 are arranged side by side in a row direction, and sub-pixels 2 at corresponding positions in two adjacent rows of sub-pixels 2 are arranged staggered in a column direction. In each row of sub-pixels 2, a via V1 for connecting the cathode layer with the wire is arranged between every two adjacent sub-pixels 2. A via V2 for connecting the anode layer with the drain electrode is arranged in a gap between two adjacent rows of sub-pixels. Alternatively, as shown in FIG. 9b, the sub-pixels 2 are arranged side by side in the column direction, and sub-pixels 2 at corresponding positions in two adjacent columns of sub-pixels 2 are arranged staggered in a row direction. In each column of sub-pixels 2, a via V1 for connecting the cathode layer with the wire is arranged between every two adjacent sub-pixels 2. A via V2 for connecting the anode layer with the drain electrode is arranged in a gap between two adjacent columns of sub-pixels. Arranging the via V1 for connecting the cathode layer with the wire between adjacent sub-pixels other than in the light-emitting layer may avoid damages to the light-emitting layer.

FIG. 10 is a flow chart of a method of driving an in-cell touch screen panel according to an embodiment of the present disclosure. As shown in FIG. 10, a frame period for each sub-pixel may comprise four phases.

At step S101, in a first phase, the driving chip outputs a reset control signal to the reset control signal terminal of the sub-pixel circuit in the sub-pixels, outputs a light-emitting control signal to the light-emitting control signal terminal, outputs a first reference signal to the first reference signal terminal, outputs a second reference signal to the second reference signal terminal, and outputs a third reference signal to the cathode layer of the organic light-emitting device through a corresponding wire. The light-emitting control module supplies the signal of the first reference signal terminal to the second node. The reset control module causes the first and node to be in conduction with the second node. The voltage stabilizing module begins to charge.

At step S102, in a second phase, the driving chip outputs a write control signal to the write control signal terminal of the sub-pixel circuit in the sub-pixels, outputs a data signal to the data signal terminal, outputs the first reference signal to the first reference signal terminal, outputs the second reference signal to the second reference signal terminal, and outputs the third reference signal to the cathode layer of the organic light-emitting device in the sub-pixels through the corresponding wire. The write compensating module supplies the signal of the data signal terminal and a preset threshold voltage to the first node. The preset threshold voltage has a difference from a threshold voltage of the driving control module in a preset range. The voltage stabilizing module begins to discharge.

At step S103, in a third phase, the driving chip outputs a light-emitting control signal to the light-emitting control signal terminal of the sub-pixel circuit in the sub-pixels, outputs the first reference signal to the first reference signal terminal, outputs the second reference signal to the second reference signal terminal, and outputs the third reference signal to the cathode layer of the organic light-emitting device in the sub-pixels through the corresponding wire. The first node is in a floating state. The voltage stabilizing module maintains a voltage difference thereacross at a fixed value. The driving control module, under joint control of the voltage stabilizing module and light-emitting control module, drives the organic light-emitting device to emit light.

At step S104, in a fourth phase, the driving chip outputs signals to respective signal terminals of the sub-pixel circuit in the sub-pixels and to the cathode layer, each of which signals is a superposition of the signal output in the third phase with a touch scanning signal to enable an operating state of modules of the sub-pixel circuit to be identical with that in the third phase, and the driving chip determines a touch position by detecting a change in capacitance of the cathode layer via the corresponding wire.

Embodiments of the present disclosure further provide a display device, which comprises the in-cell touch screen panel provided by the above embodiments. The display device may be any product or component that has display functionality such as a mobile phone, a flat panel computer, a TV set, a display, a notable computer, a digital photo frame and a navigator. Reference can be made to the aforesaid embodiments regarding the in-cell touch screen panel for the implementation of the display device, and thus no detailed description will be presented here.

In the in-cell touch screen panel, the driving method thereof and the display device according to embodiments of the present disclosure, one sub-pixel group is comprised of at least two sub-pixels, and cathode layers of different sub-pixel groups are independent of one another. This results from segmenting the cathode layer that is otherwise a whole surface in the prior art, and thus a sub-pixel group corresponds to a segment region in the segmented cathode layer. The cathode layer of each sub-pixel group is connected with the driving chip through the wire, which cathode layer is then reused as a self-capacitance touch electrode. The driving chip applies a touch scanning signal to the cathode layer via the wire, and determines a touch position by detecting a change in capacitance of the cathode layer via the conductive wire, thereby achieving touch control functionality. Furthermore, in the in-cell touch screen panel, each of the signals output by the driving chip to the signal terminals of the sub-pixel circuit and to the cathode layer in the fourth phase is a superposition of the signal output in the third phase with a touch scanning signal. This allows the sub-pixel circuit to operate in the same state as in the third phase (i.e., the light-emitting display phase). As such, where the touch screen panel is not touched by a human body, the capacitance provided by respective self-capacitance electrodes remains unchanged before and after application of the touch scanning signal, thereby ensuring accuracy of the touch position determination.

Various modification and variations to embodiments of the present disclosure may be made by a person having ordinary skill in the art without departing from the spirit and scope of the present disclosure. Thus, if these modifications and variations fall within the scope of the appended claims of the present disclosure and equivalents thereof, the present disclosure is intended to encompass these modifications and variations.

What is claimed is:

1. An in-cell touch screen panel, comprising:
an array substrate;
a plurality of sub-pixels located on the array substrate, each of the plurality of sub-pixels comprising an organic light-emitting device and a sub-pixel circuit electrically connected with the organic light-emitting device, the organic light-emitting device comprising an anode layer, a light-emitting layer and a cathode layer that are located on the array substrate in turn; and
a driving chip;
wherein the plurality of sub-pixels is grouped into sub-pixel groups each comprising at least two sub-pixels, wherein cathode layers of different sub-pixel groups are independent of one another; and
wherein the driving chip is configured to output signals to signal terminals of each sub-pixel circuit and to the cathode layer of each sub-pixel group, wherein each of the signals output in a touch scanning phase is a superposition of the signal output in a preceding phase with a touch scanning signal such that each sub-pixel circuit operates in the touch scanning phase in the same state as in the preceding phase,
wherein the sub-pixel circuit comprises a write compensating module, a voltage stabilizing module, a reset control module, a light-emitting control module, a driving control module, a data signal terminal, a write control signal terminal, a reset control signal terminal, a light-emitting control signal terminal, a first reference signal terminal and a second reference signal terminal, wherein:
the write compensating module has an input terminal connected with the data signal terminal, a control terminal connected with the write control signal terminal, and an output terminal connected with a first node which is a connection point of the write compensating module and the reset control module;
the light-emitting control module has an input terminal connected with the first reference signal terminal, a control terminal connected with the light-emitting control terminal, and an output terminal connected with a second node which is a connection point of the light-emitting control module and the driving control module;
the reset control module has an input terminal connected with the second node, a control terminal connected with the reset control signal terminal, and an output terminal connected with the first node;
the voltage stabilizing module has a first terminal connected with the second reference signal terminal, and a second terminal connected with the first node; and
the driving control module has an input terminal connected with the second node, a control terminal connected with the first node, and an output terminal connected with the anode layer of a corresponding one of the organic light-emitting devices; and
wherein the cathode layer of each sub-pixel group is connected with the driving chip via a corresponding wire.

2. The in-cell touch screen panel according to claim 1, wherein:
the reset control module is configured, under control of the reset control signal terminal, to cause the first node to be in conduction with the second node;
the light-emitting control module is configured, under control of the light-emitting control signal terminal, to supply the signal of the first reference signal terminal to the second node;
the write compensating module is configured, under control of the write control signal terminal, to supply the signal of the data signal terminal and a preset threshold voltage to the first node, wherein the preset threshold voltage has a difference from a threshold voltage of the driving control module in a preset range;
the voltage stabilizing module is configured to perform charging or discharging according to a potential of the first node, and to maintain a voltage difference across the voltage stabilizing module to be a fixed value in response to the first node being in a floating state; and
the driving control module is configured, under joint control of the voltage stabilizing module and the light-emitting control module, to drive the organic light-emitting device to emit light.

3. The in-cell touch screen panel according to claim 2, wherein the write compensating module comprises:

a first switch transistor having a gate that is the control terminal of the write compensating module, a source that is the input terminal of the write compensating module, and a drain; and a first drive transistor having a gate, a drain connected to the gate to serve as the output terminal of the write compensating module, and a source connected with the drain of the first switch transistor, wherein the first drive transistor has a threshold voltage that is equal to the preset threshold voltage.

4. The in-cell touch screen panel according to claim 3, wherein the first switch transistor is an N-type transistor or a P-type transistor.

5. The in-cell touch screen panel according to claim 3, wherein the sub-pixel circuit is located between the anode layer and the array substrate, wherein the array substrate further comprises data lines for respectively connecting the data signal terminals in respective sub-pixel circuits with the driving chip, and wherein the wire is disposed in the same layer as and insulated from the data lines.

6. The in-cell touch screen panel according to claim 5, wherein each transistor in the sub-pixel circuit comprises an active layer, a gate insulating layer, a gate electrode, an insulating layer, a source electrode, and a drain electrode that are located on the array substrate in turn, wherein the source electrode and the drain electrode are disposed on the same layer as the data lines, and wherein the wire is connected with a corresponding one of the cathode layers through a via.

7. The in-cell touch screen panel according to claim 6, further comprising:

a planarized layer located between a layer where the source electrode and the drain electrode are disposed and the anode layer;

a sub-pixel limiting layer located between the cathode layer and the planarized layer and surrounding the light-emitting layer; and a cathode connecting portion disposed on the same layer as the anode layer;

wherein the cathode connecting portion is connected with the corresponding wire through a via running through the planarized layer; and wherein the cathode layer is connected with the corresponding cathode connecting portion through a via running through the sub-pixel limiting layer.

8. The in-cell touch screen panel according to claim 6, wherein the plurality of sub-pixels are regularly arranged on the array substrate, each of which is of a hexagonal shape, wherein the sub-pixels are arranged side by side in a row direction, and the sub-pixels at corresponding positions in every two adjacent rows are arranged staggered in a column direction, wherein the in-cell touch screen panel further comprises a via arranged between every two adjacent sub-pixels in each row for connecting the cathode layer with the wire, and a via arranged in a gap between two adjacent rows for connecting the anode layer with the drain electrode.

9. The in-cell touch screen panel according to claim 6, wherein the plurality of sub-pixels are regularly arranged on the array substrate, each of which is of a hexagonal shape, wherein the sub-pixels are arranged side by side in a column direction, and the sub-pixels at corresponding positions in every two adjacent columns are arranged staggered in a row direction, wherein the in-cell touch screen panel further comprises a via arranged between every two adjacent sub-pixels in each column for connecting the cathode layer with the wire, and a via arranged in a gap between two adjacent columns for connecting the anode layer with the drain electrode.

10. The in-cell touch screen panel according to claim 2, wherein the difference between the preset threshold voltage and the threshold voltage of the driving control module is less than 5% of the threshold voltage of the driving control module.

11. The in-cell touch screen panel according to claim 1, wherein the driving chip is configured during a frame period to:

output, in a first phase, a light-emitting control signal to the light-emitting control signal terminal of the sub-pixel circuit of the sub-pixel, and a reset control signal to the reset control signal terminal;

output, in a second phase, a write control signal to the write control signal terminal, and a data signal to the data signal terminal;

output, in a third phase, a light-emitting control signal to the light-emitting control signal terminal; and output, in a fourth phase that is the touch scanning phase, to the signal terminals of the sub-pixel circuit and to the cathode layer of each sub-pixel group a superposition of respective signals output to the signal terminals and the cathode layer in the third phase with a same touch scanning signal, and determine a touch position by detecting a change in capacitance of the cathode layer via the corresponding wire; and wherein the driving chip is configured to output, from the first phase to the third phase, a first reference signal to the first reference signal terminal, a second reference signal to the second reference signal terminal, and a third reference signal to the cathode layer of the organic light-emitting device of the sub-pixel via the corresponding wire.

12. The in-cell touch screen panel according to claim 1, wherein the driving control module comprises a second drive transistor having a gate that is the control terminal of the driving control module, a drain that is the input terminal of the driving control module, and a source that is the output terminal of the driving control module.

13. The in-cell touch screen panel according to claim 1, wherein the reset control module comprises a second switch transistor having a gate that is the control terminal of the reset control module, a source that is the input terminal of the reset control module, and a drain that is the output terminal of the reset control module.

14. The in-cell touch screen panel according to claim 1, wherein the voltage stabilizing module comprises a capacitor having a first terminal that is the first terminal of the voltage stabilizing module, and a second terminal that is the second terminal of the voltage stabilizing module.

15. The in-cell touch screen panel according to claim 1, wherein the light-emitting control module comprises a third switch transistor having a gate that is the control terminal of the light-emitting control module, a source that is the input terminal of the light-emitting control module, and a drain that is the output terminal of the light-emitting control module.

16. A display device comprising the in-cell touch screen panel according to claim 1.

17. A method of driving the in-cell touch screen panel according to claim 1, comprising:

outputting, by the driving chip during a frame period, signals to signal terminals of each sub-pixel circuit and to the cathode layer of each sub-pixel group, wherein each of the signals output in a touch scanning phase is a superposition of the signal output in a preceding phase with a touch scanning signal such that each sub-pixel circuit operates in the touch scanning phase in the same state as in the preceding phase.

18. The method according to claim 17, wherein the sub-pixel circuit comprises a write compensating module, a voltage stabilizing module, a reset control module, a light-emitting control module, a driving control module, a data signal terminal, a write control signal terminal, a reset control signal terminal, a light-emitting control signal terminal, a first reference signal terminal and a second reference signal terminal, wherein:
   the write compensating module has an input terminal connected with the data signal terminal, a control terminal connected with the write control signal terminal, and an output terminal connected with a first node which is a connection point of the write compensating module and the reset control module;
   the light-emitting control module has an input terminal connected with the first reference signal terminal, a control terminal connected with the light-emitting control terminal, and an output terminal connected with a second node which is a connection point of the light-emitting control module and the driving control module;
   the reset control module has an input terminal connected with the second node, a control terminal connected with the reset control signal terminal, and an output terminal connected with the first node;
   the voltage stabilizing module has a first terminal connected with the second reference signal terminal, and a second terminal connected with the first node;
   the driving control module has an input terminal connected with the second node, a control terminal connected with the first node, and an output terminal connected with the anode layer of a corresponding one of the organic light-emitting devices; and
   the cathode layer of each sub-pixel group is connected with the driving chip via a corresponding wire; and
wherein the method comprises:
   outputting, by the driving chip in a first phase of the frame period, a reset control signal to the reset control signal terminal, a light-emitting control signal to the light-emitting control signal terminal, a first reference signal to the first reference signal terminal, a second reference signal to the second reference signal terminal, and a third reference signal to the cathode layer of the organic light-emitting device through a corresponding wire, such that the light-emitting control module supplies the signal of the first reference signal terminal to the second node, the reset control module causes the first node to be in conduction with the second node, and the voltage stabilizing module begins to charge;
   outputting, by the driving chip in a second phase of the frame period, a write control signal to the write control signal terminal, a data signal to the data signal terminal, the first reference signal to the first reference signal terminal, the second reference signal to the second reference signal terminal, and the third reference signal to the cathode layer of the organic light-emitting device in the sub-pixels through the corresponding wire, such that the write compensating module supplies the signal of the data signal terminal and a preset threshold voltage to the first node, and the voltage stabilizing module begins to discharge, wherein the preset threshold voltage has a difference from a threshold voltage of the driving control module in a preset range;
   outputting, by the driving chip in a third phase of the frame period, a light-emitting control signal to the light-emitting control signal terminal, the first reference signal to the first reference signal terminal, the second reference signal to the second reference signal terminal, and the third reference signal to the cathode layer of the organic light-emitting device in the sub-pixels through the corresponding wire, such that the first node is in a floating state, the voltage stabilizing module maintains a voltage difference thereacross at a fixed value, and the driving control module, under joint control of the voltage stabilizing module and the light-emitting control module, drives the organic light-emitting device to emit light; and
   outputting, by the driving chip in a fourth phase of the frame period that is the touch scanning phase, to the signal terminals of the sub-pixel circuit and to the cathode layer of each sub-pixel group a superposition of respective signals output to the signal terminals and the cathode layer in the third phase with a same touch scanning signal, and determining a touch position by detecting a change in capacitance of the cathode layer via the corresponding wire.

\* \* \* \* \*